United States Patent
Jogalekar et al.

(10) Patent No.: US 12,519,070 B2
(45) Date of Patent: Jan. 6, 2026

(54) SYSTEM, ELECTRONIC DEVICE AND PACKAGE WITH VERTICAL TO HORIZONTAL SUBSTRATE INTEGRATED WAVEGUIDE TRANSITION AND HORIZONTAL GROUNDED COPLANAR WAVEGUIDE TRANSITION

(71) Applicant: Texas Instruments Incorporated, Dallas, TX (US)

(72) Inventors: Aditya Nitin Jogalekar, Dallas, TX (US); Harshpreet Singh Phull Bakshi, Dallas, TX (US); Rajen Manicon Murugan, Dallas, TX (US); Sylvester Ankamah-Kusi, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 564 days.

(21) Appl. No.: 18/146,886

(22) Filed: Dec. 27, 2022

(65) Prior Publication Data
US 2024/0213185 A1    Jun. 27, 2024

(51) Int. Cl.
| | |
|---|---|
| *H01L 23/00* | (2006.01) |
| *H01L 21/48* | (2006.01) |
| *H01L 21/56* | (2006.01) |
| *H01L 23/31* | (2006.01) |
| *H01L 23/498* | (2006.01) |

(Continued)

(52) U.S. Cl.
CPC ......... *H01L 23/66* (2013.01); *H01L 21/4853* (2013.01); *H01L 21/4857* (2013.01); *H01L 21/565* (2013.01); *H01L 23/3121* (2013.01); *H01L 23/49822* (2013.01); *H01L 23/49838* (2013.01); *H01P 3/003* (2013.01); *H01P 3/121* (2013.01); *H01P 5/107* (2013.01);

(Continued)

(58) Field of Classification Search
CPC ......... H01L 23/49838; H01L 23/49822; H01L 23/3121; H01L 2223/6633; H01L 2223/6627; H01L 2223/6677; H01P 11/002; H01P 11/003; H01P 5/107; H01P 3/121
See application file for complete search history.

(56) References Cited

U.S. PATENT DOCUMENTS

| | | |
|---|---|---|
| 3,388,339 A | 6/1968 | Malnar et al. |
| 8,217,724 B2 | 7/2012 | Briggs et al. |

(Continued)

OTHER PUBLICATIONS

Y. Zhang and J. Mao, "An Overview of the Development of Antenna-in-Package Technology for Highly Integrated Wireless Devices," in Proceedings of the IEEE, vol. 107, No. 11, pp. 2265-2280, Nov. 2019, doi: 10.1109/JPROC.2019.2933267.

(Continued)

*Primary Examiner* — Reema Patel
(74) *Attorney, Agent, or Firm* — Ronald O. Neerings; Frank D. Cimino

(57) ABSTRACT

An electronic device includes a multilevel package substrate with a horizontal substrate integrated waveguide (SIW) with a channel, a vertical SIW with an opening, a grounded coplanar waveguide (GCPW), a first transition between the horizontal SIW and the GCPW, and a second transition between the horizontal and vertical SIWs, as well as a semiconductor die having conductive structures coupled to a signal trace and a ground trace of the GCPW, and a package structure that encloses the semiconductor die and a portion of the multilevel package substrate.

20 Claims, 31 Drawing Sheets

(51) Int. Cl.
  *H01L 23/66* (2006.01)
  *H01P 3/00* (2006.01)
  *H01P 3/12* (2006.01)
  *H01P 5/107* (2006.01)
  *H01P 11/00* (2006.01)

(52) U.S. Cl.
  CPC .......... *H01P 11/002* (2013.01); *H01P 11/003* (2013.01); *H01L 2223/6633* (2013.01)

(56) References Cited

U.S. PATENT DOCUMENTS

| | | |
|---|---|---|
| 8,624,682 B2 | 1/2014 | Ridley et al. |
| 8,680,854 B2 | 3/2014 | Dyer et al. |
| 8,836,327 B2 | 9/2014 | French et al. |
| 8,906,470 B2 | 12/2014 | Overstolz et al. |
| 9,201,404 B2 | 12/2015 | Harasaka et al. |
| 9,529,334 B2 | 12/2016 | Herbsommer et al. |
| 10,424,523 B2 | 9/2019 | Fruehling et al. |
| 2005/0007118 A1 | 1/2005 | Kitching et al. |
| 2005/0271250 A1 | 12/2005 | Vallone et al. |
| 2006/0022761 A1 | 2/2006 | Abeles et al. |
| 2006/0261252 A1 | 11/2006 | Cole et al. |
| 2007/0164907 A1 | 7/2007 | Gaucher et al. |
| 2007/0247241 A1 | 10/2007 | Bruan et al. |
| 2010/0156547 A1 | 6/2010 | McGuyer et al. |
| 2010/0189605 A1 | 7/2010 | Schmid et al. |
| 2011/0128082 A1 | 6/2011 | Maki et al. |
| 2011/0147367 A1 | 6/2011 | Borwick, III et al. |
| 2013/0015850 A1 | 1/2013 | Lindorfer et al. |
| 2013/0021208 A1 | 1/2013 | Seok et al. |
| 2013/0026586 A1 | 1/2013 | Seok et al. |
| 2013/0044921 A1 | 2/2013 | In et al. |
| 2013/0059551 A1 | 3/2013 | Ginsburg et al. |
| 2013/0147472 A1 | 6/2013 | French et al. |
| 2013/0176703 A1 | 7/2013 | Hopper et al. |
| 2013/0299967 A1 | 11/2013 | Daniels et al. |
| 2014/0285289 A1 | 9/2014 | Herbsommer et al. |
| 2014/0287701 A1 | 9/2014 | Herbsommer et al. |
| 2014/0287703 A1 | 9/2014 | Herbsommer et al. |
| 2014/0347074 A1 | 11/2014 | Nadeau |
| 2014/0368377 A1 | 12/2014 | Nadeau et al. |
| 2014/0373599 A1 | 12/2014 | Trombley et al. |
| 2015/0001694 A1 | 1/2015 | Hopper et al. |
| 2015/0027908 A1 | 1/2015 | Parsa et al. |
| 2015/0028866 A1 | 1/2015 | Parsa et al. |
| 2015/0084707 A1 | 3/2015 | Maki |
| 2015/0244382 A1 | 8/2015 | Ishihara |
| 2015/0277386 A1 | 10/2015 | Passilly et al. |
| 2015/0280320 A1 | 10/2015 | Haroun et al. |
| 2015/0295305 A1 | 10/2015 | Herbsommer et al. |
| 2016/0233178 A1 | 8/2016 | Lamy et al. |
| 2016/0276731 A1 | 9/2016 | Seok et al. |
| 2017/0093010 A1 | 3/2017 | Herbsommer et al. |
| 2018/0156875 A1 | 6/2018 | Herbsommer et al. |
| 2019/0013288 A1 | 1/2019 | Kim et al. |
| 2019/0152773 A1 | 5/2019 | Herbsommer et al. |
| 2019/0334220 A1 | 10/2019 | Ali et al. |
| 2019/0346814 A1 | 11/2019 | Fruehling et al. |
| 2020/0118949 A1 | 4/2020 | Moallem et al. |
| 2020/0194871 A1 | 6/2020 | Moallem et al. |
| 2020/0212536 A1 | 7/2020 | Gupta et al. |
| 2020/0241480 A1 | 7/2020 | Bahr et al. |
| 2020/0259239 A1 | 8/2020 | Moallem et al. |
| 2020/0259240 A1 | 8/2020 | Moallem |
| 2020/0336383 A1 | 10/2020 | Lui et al. |
| 2020/0403299 A1 | 12/2020 | Gupta et al. |
| 2021/0050652 A1 | 2/2021 | Moallem et al. |

OTHER PUBLICATIONS

F. Ahmed, M. Furqan and A. Stelzer, "120-GHz and 240-GHz Broadband Bow-Tie Antennas in eWLB Package for High Resolution Radar Applications," 2018 48th European Microwave Conference (EuMC), 2018, pp. 1109-1112, doi: 10.23919/EuMC.2018.8541732.

S. Beer and T. Zwick, "122 GHz antenna-integration in a plastic package based on a flip chip interconnect," 2011 IEEE MTT-S International Microwave Workshop Series on Millimeter Wave Integration Technologies, 2011, pp. 37-40, doi: 10.1109/IMWS3.2011.6061881.

C. Wang et al., "InFO_AiP Technology for High Performance and Compact 5G Millimeter Wave System Integration," 2018 IEEE 68th Electronic Components and Technology Conference (ECTC), 2018, pp. 202-207, doi: 10.1109/ECTC.2018.00039.

A. O. Watanabe et al., "3D Glass-Based Panel-Level Package with Antenna and Low-Loss Interconnects for Millimeter-Wave 5G Applications," 2019 IEEE MTT-S International Microwave Conference on Hardware and Systems for 5G and Beyond (IMC-5G), 2019, pp. 1-3, doi: 10.1109/IMC-5G47857.2019.9160350.

240

| | FREQUENCY [GHz] | re(Zo(2)) Setup1 : Sweep |
|---|---|---|
| 1 | 140.000000 | 430.602448 |
| 2 | 150.000000 | 381.101632 |
| 3 | 160.000000 | 351.215678 |
| 4 | 170.000000 | 331.137161 |
| 5 | 180.000000 | 316.718082 |
| 6 | 190.000000 | 305.877117 |
| 7 | 200.000000 | 297.447052 |
| 8 | 210.000000 | 290.719702 |
| 9 | 220.000000 | 285.239355 |

| | FREQUENCY [GHz] | re(Zo(2)) Setup1 : Sweep |
|---|---|---|
| 1 | 140.000000 | 104.789217 |
| 2 | 150.000000 | 49.364037 |
| 3 | 160.000000 | 38.259411 |
| 4 | 170.000000 | 33.149755 |
| 5 | 180.000000 | 30.146600 |
| 6 | 190.000000 | 28.154626 |
| 7 | 200.000000 | 26.733227 |
| 8 | 210.000000 | 25.667776 |
| 9 | 220.000000 | 24.840191 |

FIG. 2E

SYSTEM, ELECTRONIC DEVICE AND PACKAGE WITH VERTICAL TO HORIZONTAL SUBSTRATE INTEGRATED WAVEGUIDE TRANSITION AND HORIZONTAL GROUNDED COPLANAR WAVEGUIDE TRANSITION

BACKGROUND

Integrating waveguides in packaged electronic devices helps reduce system size, increase component density and support device communications, for example, mm-wave communications for automotive, telecommunications, industrial, and other applications. However, improved waveguides and packaged transitions for electronic devices are desired for better system performance.

SUMMARY

In one aspect, an electronic device includes a multilevel package substrate, a semiconductor die and a package structure that encloses the semiconductor die and a portion of the multilevel package substrate. The multilevel package substrate has three or more levels, a horizontal substrate integrated waveguide (SIW), a vertical SIW, a grounded coplanar waveguide (GCPW) as well as first and second transitions. The horizontal SIW includes a first set of conductive features of the first and second levels that surround a channel. The first transition includes a signal trace and a ground trace in the first level that connect the horizontal SIW to the GCPW. The vertical SIW includes a second set of conductive features that surround an opening that extends to a side of the device, and the second transition includes a conductive cover feature of the first level that extends over the opening of the vertical SIW. The semiconductor die is attached to an opposite second side of the multilevel package substrate and has a first conductive structure coupled to the signal trace and a second conductive structure coupled to the ground trace.

In another aspect, a multilevel package substrate includes three or more levels and opposite first and second sides extending in respective planes of orthogonal first and second directions. The multilevel package substrate includes a horizontal SIW that includes a first set of conductive features of the first and second levels that surround a channel that extends along the second direction, and a vertical SIW that includes a second set of conductive features of the first, second and third levels that surround an opening that extends along a third direction that is orthogonal to the first and second directions. The multilevel package substrate also includes a grounded coplanar waveguide, a first transition with a signal trace and a ground trace in the first level that connect the horizontal SIW to the GCPW along the second side, and a second transition includes a conductive cover feature of the first level that extends over the opening of the vertical SIW.

In a further aspect, a system includes a printed circuit board (PCB) with a conductive structure to connect to a vertical substrate integrated waveguide, and an electronic device attached to the PCB and comprising a multilevel package substrate, a semiconductor die, and a package structure that encloses the semiconductor die and a portion of the multilevel package substrate. The multilevel package substrate has a first side, a second side, a first level, a second level, a third level, a horizontal SIW, a vertical SIW, a GCPW, a first transition, and a second transition. The horizontal SIW includes a first set of conductive features of the first and second levels that surround a channel. The first transition includes a signal trace and a ground trace in the first level that connect the horizontal SIW to the GCPW. The vertical SIW includes a second set of conductive features of the first, second and third levels that surround an opening that extends to a side of the device, and the second transition includes a conductive cover feature of the first level that extends over the opening of the vertical SIW. The semiconductor die is attached to a second side of the multilevel package substrate and has a first conductive structure coupled to the signal trace and a second conductive structure coupled to the ground trace.

In another aspect, a method of fabricating an electronic device includes fabricating a multilevel package substrate has: opposite first and second sides extending in respective first and second planes of orthogonal first and second directions, the first and second planes spaced apart from one another along a third direction that is orthogonal to the first and second directions; a first level; a second level; a third level; a horizontal substrate integrated waveguide (SIW); a vertical SIW; a grounded coplanar waveguide (GCPW); a first transition; and a second transition, the horizontal SIW includes a first set of conductive features of the first and second levels that surround a channel that extends along the second direction, the first transition includes a signal trace and a ground trace in the first level that connect the horizontal SIW to the GCPW along the second side, the vertical SIW includes a second set of conductive features of the first, second and third levels that surround an opening that extends along the third direction to the first side, and the second transition includes a conductive cover feature of the first level that extends over the opening of the vertical SIW. The method also includes attaching a semiconductor die to the second side of the multilevel package substrate, coupling a first conductive structure of the semiconductor die to the signal trace, coupling a second conductive structure of the semiconductor die to the ground trace, and forming a package structure that encloses the semiconductor die and a portion of the multilevel package substrate.

BRIEF DESCRIPTION OF THE DRAWINGS

FIG. 2D is a table of vertical SIW impedance values at different frequencies in the WR5 band in one implementation of the electronic device of FIGS. 1-1H.

FIG. 2E is a table of horizontal SIW impedance values at different frequencies in the WR5 band in one implementation of the electronic device of FIGS. 1-1H.

DETAILED DESCRIPTION

Figure 1:
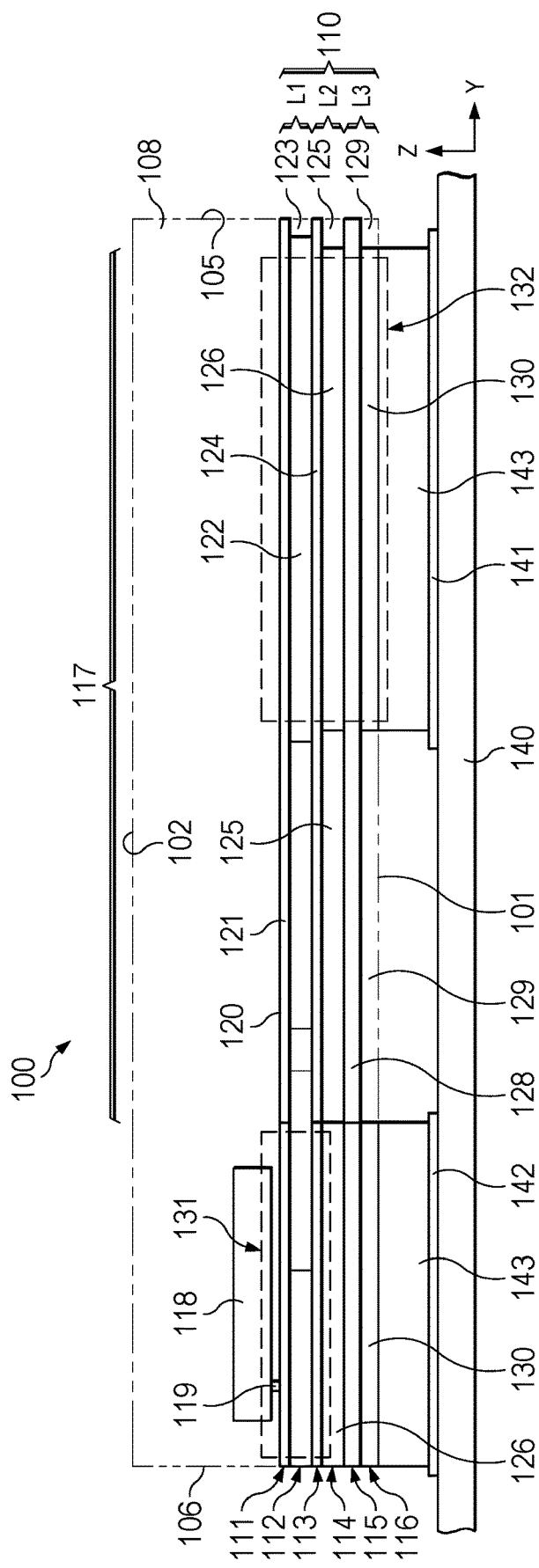
FIG. 1 is a side view of a system with a mm-wave radar receiver electronic device with horizontal and vertical SIWs, a GCPW, a first transition between the horizontal SIW and the GCPW and a second transition between the horizontal and vertical SIWs.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. The example structures include layers or materials described as over or on another layer or material, which can be a layer or material directly on and contacting the other layer or material where other materials, such as impurities or artifacts or remnant materials from fabrication processing may be present between the layer or material and the other layer or material. Unless otherwise stated, "about," "approximately," or "substantially" preceding a value means +/−10 percent of the stated value.

Figure 1A:
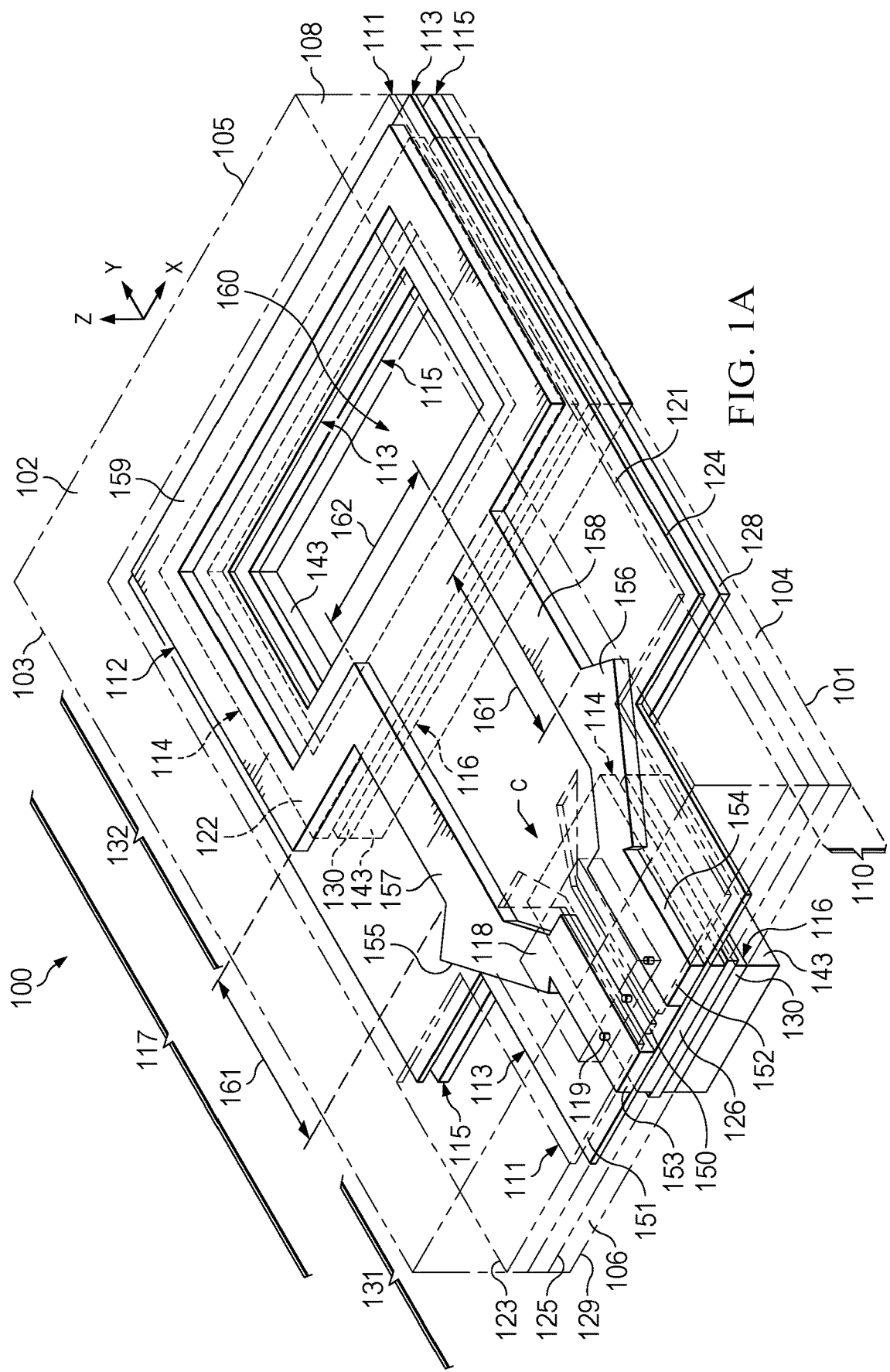
FIG. 1A is a top perspective view of the electronic device of FIG. 1.
Figure 1B:
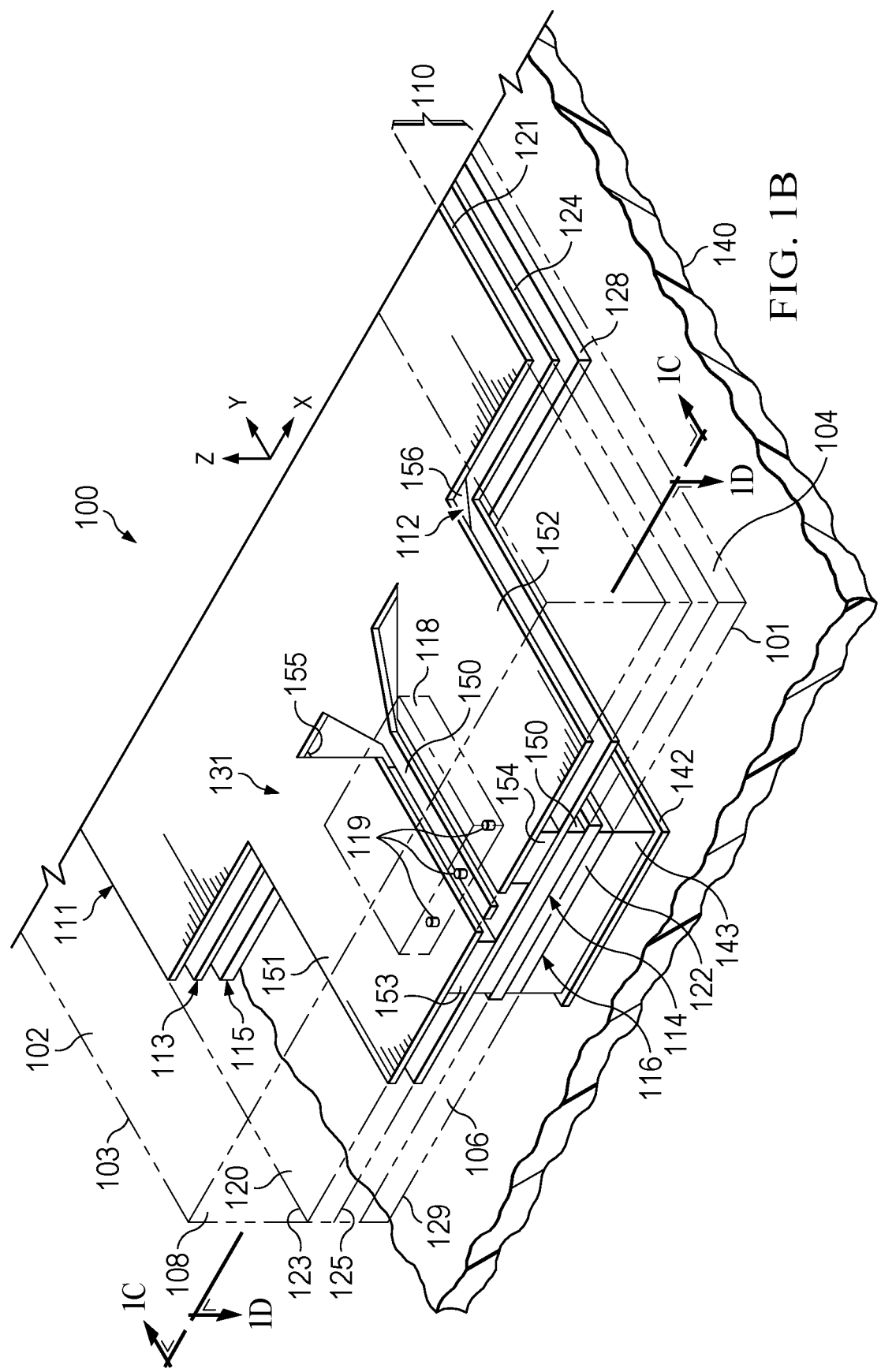
FIG. 1B is a partial top perspective view of the GCPW, the first transition, and the horizontal SIW in a portion of the electronic device of FIGS. 1 and 1A.
Figure 1C:
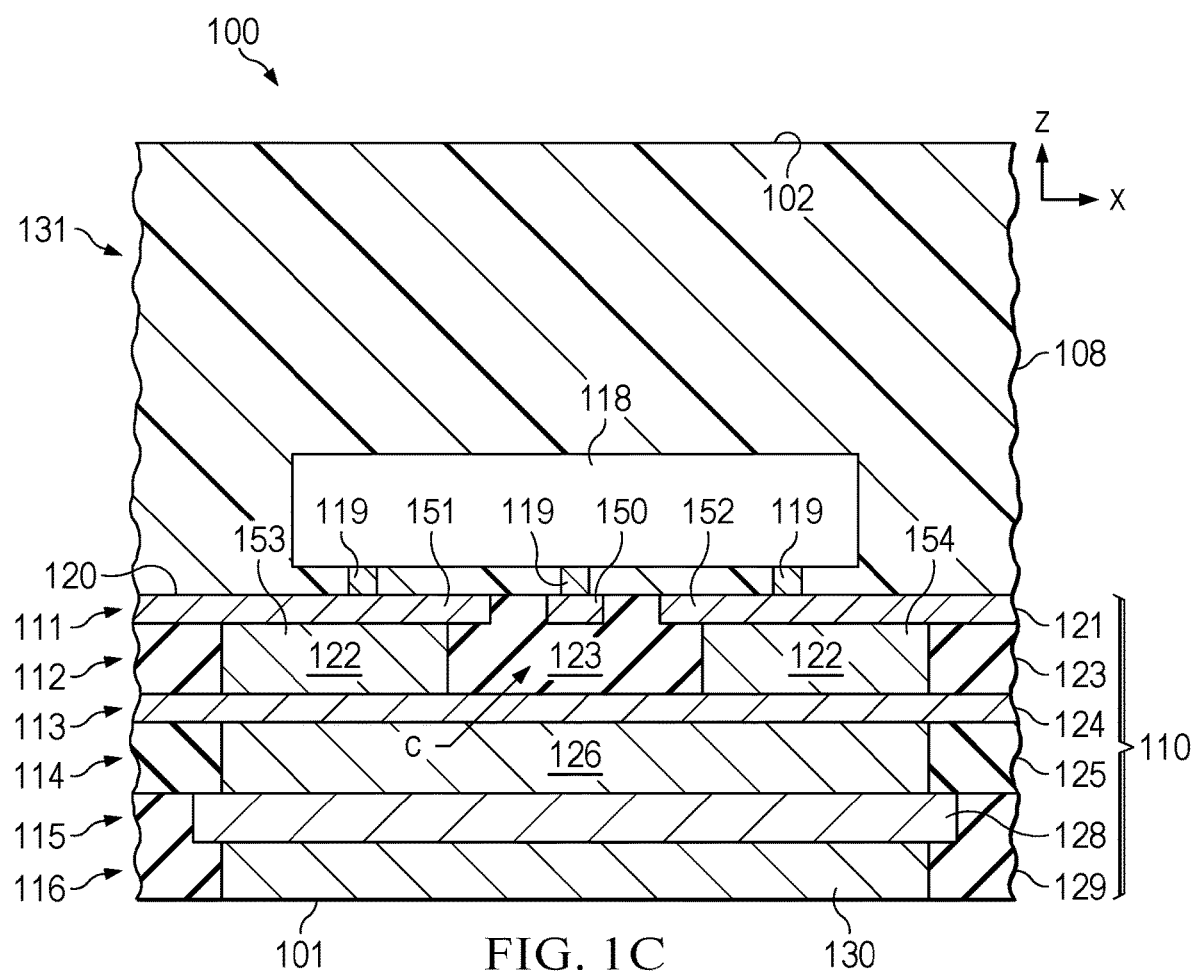
FIG. 1C is a partial sectional end view taken along line 1C-1C of FIG. 1B.
Figure 1D:
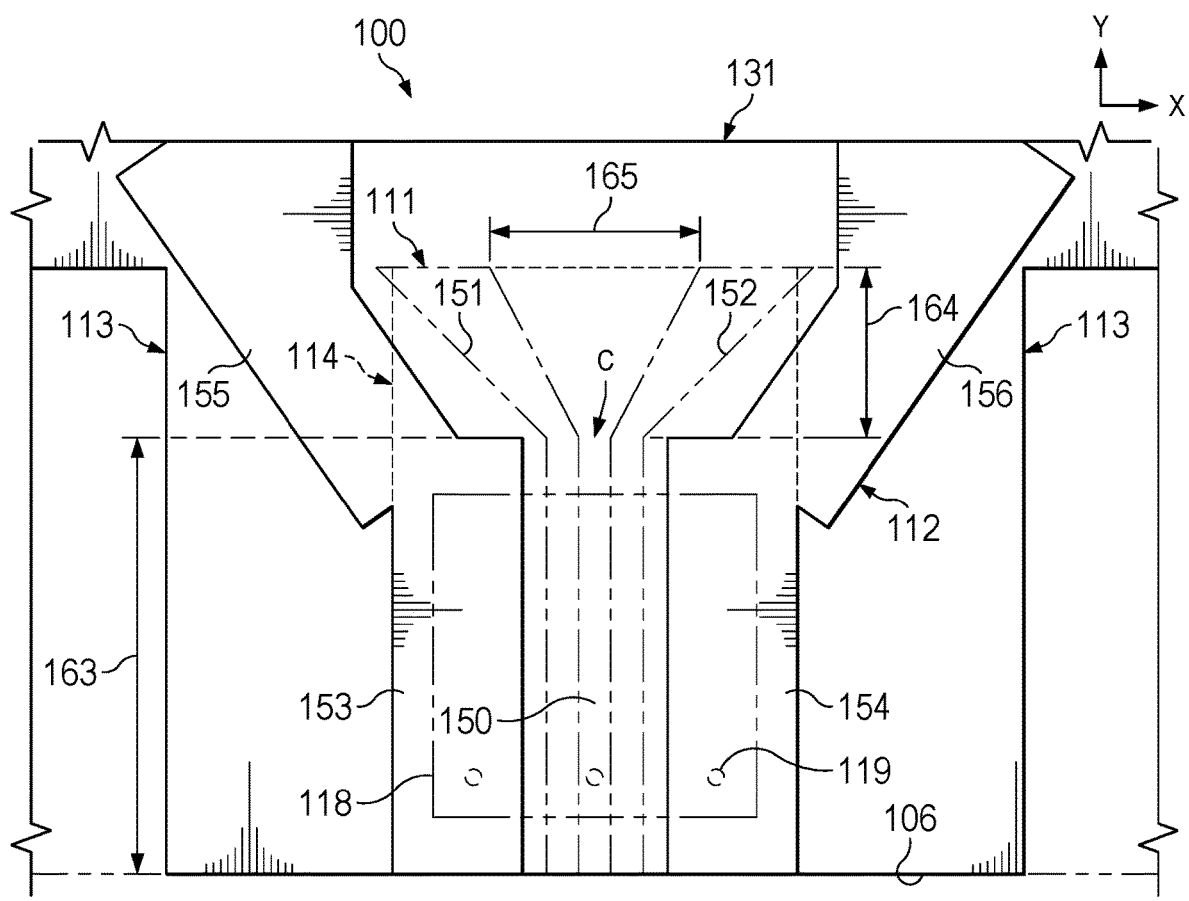
FIG. 1D is a partial top plan view of the GCPW, the first transition, and the horizontal SIW in a portion of the electronic device of FIGS. 1-1C.
Figure 1E:
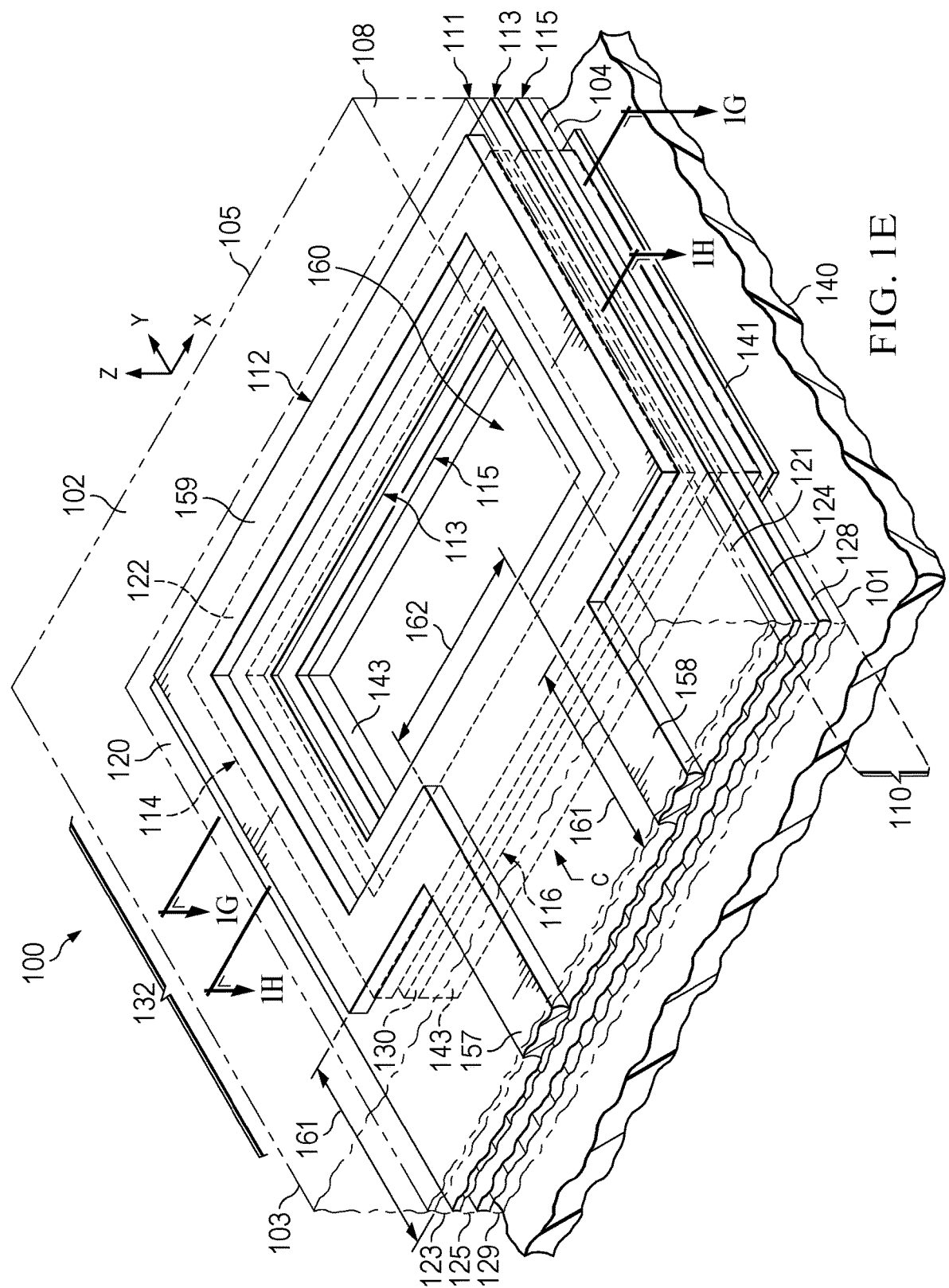
FIG. 1E is a partial top plan view of the horizontal and vertical SIWs and the second transition in another portion of the electronic device of FIGS. 1-1D.
Figure 1F:
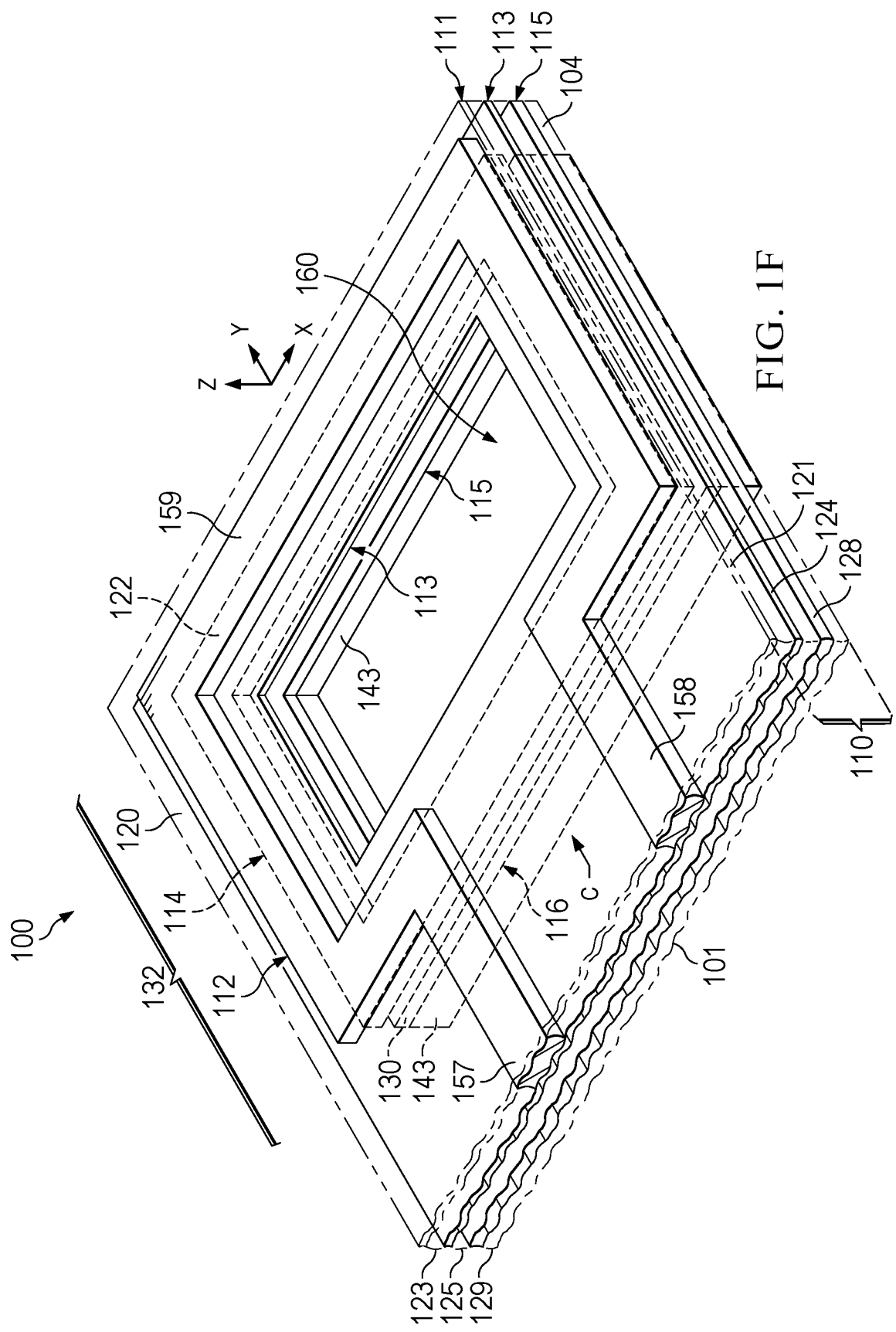
FIG. 1F is a partial top plan view of the vertical SIW and the second transition in another portion of the electronic device of FIGS. 1-1E.
Figure 1G:
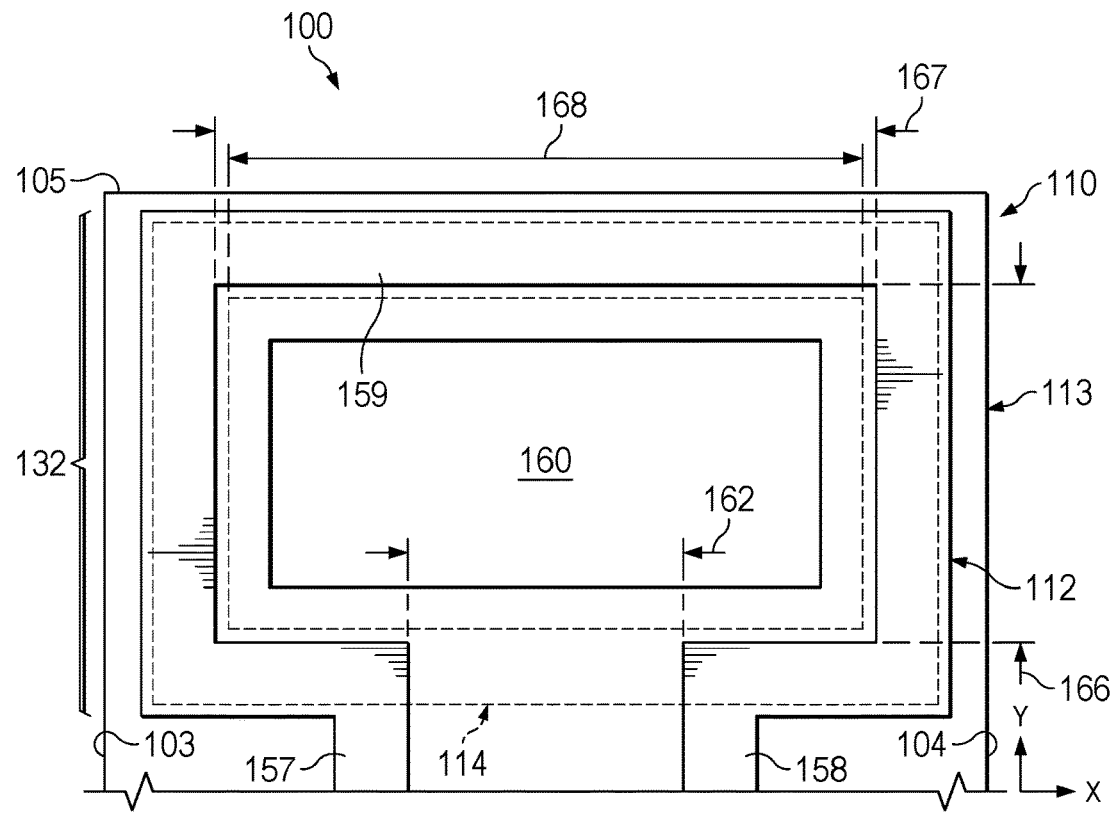
FIG. 1G is a partial sectional top view taken along line 1G-1G of FIG. 1E.
Figure 1H:
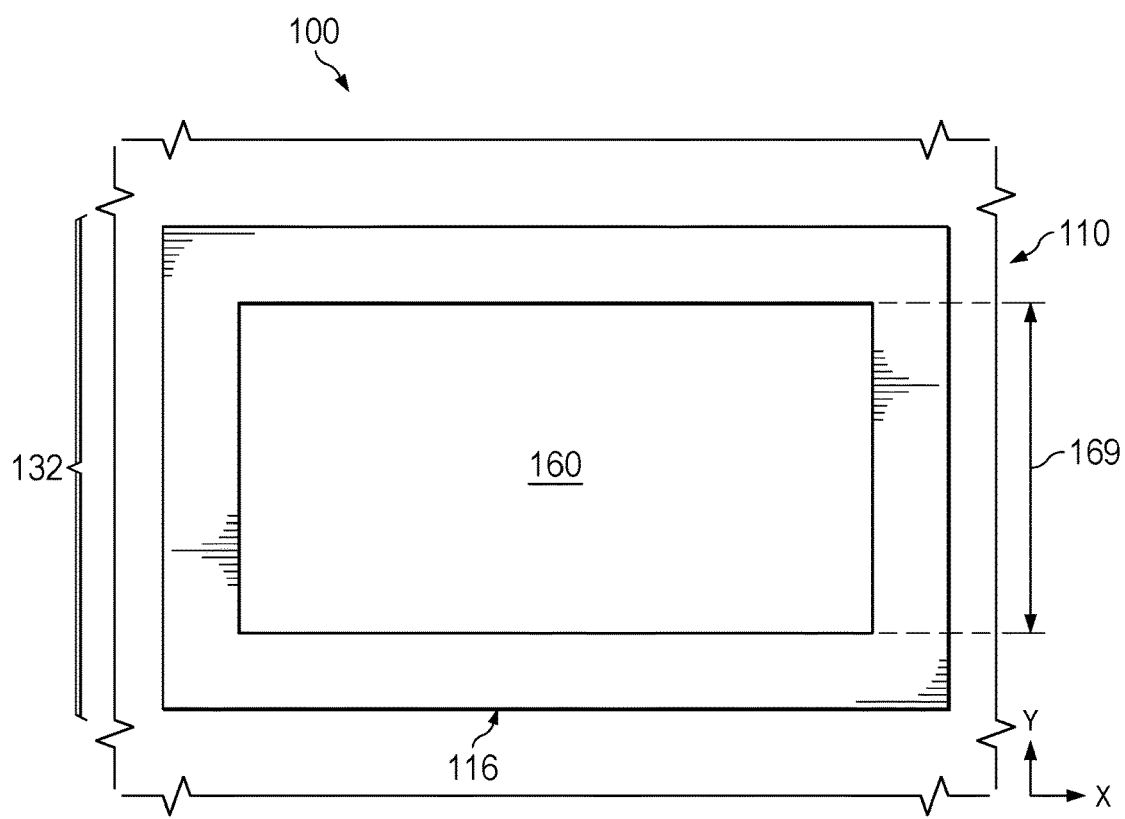
FIG. 1H is a partial sectional top view taken along line 1H-1H of FIG. 1E.

FIGS. 1-1H show a mm-wave radar receiver electronic device 100 with horizontal and vertical substrate integrated waveguides (SIWs), a grounded coplanar waveguide (GCPW), a first transition between the horizontal SIW and the GCPW and a second transition between the horizontal and vertical SIWs. FIG. 1 shows a side view of a system with the electronic device 100 and FIG. 1A shows a top perspective view of the electronic device 100. FIG. 1B shows a partial top perspective view of the GCPW, the first transition, and the horizontal SIW in a portion of the electronic device 100, FIG. 1C shows a sectional end view taken along line 1C-1C of FIG. 1B and FIG. 1D shows a partial top plan view of the GCPW, the first transition, and the horizontal SIW in a portion of the electronic device 100. FIG. 1E shows a partial top plan view of the horizontal and vertical SIWs and the second transition in another portion of the electronic device 100, FIG. 1F shows a partial top plan view of the vertical SIW and the second transition in another portion of the electronic device 100, FIG. 1G shows a partial sectional top view taken along line 1G-1G of FIG. 1E and FIG. 1H shows a partial sectional top view taken along line 1H-1H of FIG. 1E.

The electronic device 100 is shown in an example position or orientation as installed in a system in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another. The electronic device 100 has opposite first and second (e.g., bottom and top) sides 101 and 102, respectively, which are spaced apart from one another along the third direction Z. The electronic device 100 has laterally opposite third and fourth sides 103 and 104 spaced apart from one another along the first direction X, and opposite fifth and sixth sides 105 and 106 spaced apart from one another along the second direction Y in the illustrated orientation. The sides 101-106 in one example have substantially planar outer surfaces. In other examples, one or more of the sides 101-106 have curves, angled features, or other non-planar surface features.

The electronic device 100 includes a package structure 108, such as a molded plastic in one example, which extends along the sides 102-106, as well as a multilevel package substrate 110 partially enclosed by the package structure 108. As best shown in FIG. 1, the multilevel package substrate 110 has a first level L1, a second level L2 on (e.g., below) the first level L1, and a third level L3 on (e.g., below) the second level L2. In other examples, the multilevel package substrate 110 can have more than three levels. The individual levels L1-L3 extend in respective planes of the first and second directions (e.g., X-Y planes) and include conductive metal trace and via features as well as dielectric material therebetween. In the illustrated example, moreover, portions of the individual levels include cavities or spaces between conductive metal features that define a horizonal SIW waveguide channel and an opening of the vertical SIW. The trace and via features of the individual levels are or include copper, aluminum or other conductive metal or combinations thereof. The first level L1 includes a first trace layer 111 and a first via layer 112, the second level L2 includes a second trace layer 113 and a second via layer 114, and the third level L3 includes a third trace layer 115 and a third via layer 116. In other implementations, the third via layer 116 can be omitted.

The levels L1-L3 of the multilevel package substrate have conductive metal features that form a horizontal SIW 117, a vertical SIW, a GCPW and transitions therebetween to couple high frequency signals to and/or from a circuit of a semiconductor die 118 (FIGS. 1-1C) and a circuit of a host system (e.g., FIG. 1), such as a printed circuit board to which the electronic device 100 is soldered or otherwise attached. In the illustrated example, the semiconductor die 118 is flip chip soldered and attached to the second side 102 of the multilevel package substrate 110. The semiconductor die 118 has conductive structures 119 (FIGS. 1, 1B and 1C, e.g., copper pillars, posts, pads, etc.) that are soldered to and coupled to traces of the first trace layer 111. In other examples, bond wires (not shown) or other interconnection technologies can be used. The solder connections electrically couple circuitry of the semiconductor die 118 to conductive metal features of the multilevel package substrate 110 to form an integrated circuit (IC) electronic device 100. As shown in FIGS. 1-1C and 1E, the package structure 108 encloses the semiconductor die 118 and a top side of the multilevel package substrate 110.

The first level L1 of the multilevel package substrate 110 extends to a second or top side 120 of the multilevel package substrate 110. As best shown in FIG. 1, the first trace layer 111 has patterned first conductive trace features 121 and the first via layer 112 has patterned first conductive via features 122. The first level L1 also includes a first dielectric layer 123 that extends on and between the first conductive trace features 121 and between the first conductive via features 122. The second trace layer 113 has patterned second conductive trace features 124. The second level L2 also includes the second via layer 114 with patterned second conductive via features 126, and a second dielectric layer 125 that extends on and between the second conductive trace features 124 and between the second conductive via features 126. The third level L3 includes the third trace layer 115 with patterned third conductive trace features 128 and a third dielectric layer 129 that extends on and between the third conductive trace features 128. In the illustrated example, the third level L3 also includes the third via layer 116 with patterned third conductive via features 130 and the third dielectric layer 129 extends between the third conductive via features 130.

The integrated waveguide structure of the multilevel package substrate 110 includes respective first and second transitions 131 and 132 along with the horizontal SIW 117, the vertical SIW and the GCPW. FIGS. 1 and 1A illustrate both transitions 131 and 132. FIGS. 1B-1D show further details of the first transition 131 between a first end of the horizontal SIW 117 and the GCPW that is electrically coupled to the circuit of the semiconductor die 118 along the second side 120 of the multilevel package substrate 110. FIGS. 1E-1H show further details of the second transition 132 between the second end of the horizontal SIW 117 and the vertical SIW that is adapted for connection to a host printed circuit board (PCB).

FIG. 1 shows a system with the electronic device 100 installed on a PCB 140. The PCB 140 has a first conductive structure 141 that connects a circuit or feature of the host system, such as a slotted waveguide receiver antenna (not shown), to the vertical substrate integrated waveguide. The PCB 140 in this example also has a second conductive feature 142 to which the first end of the electronic device 100 is soldered. The corresponding conductive metal features of the third via layer 116 are attached to the respective conductive features 141 and 142 of the PCB 140 by solder 143 shown in FIGS. 1-1B, 1E and 1F.

As best shown in FIGS. 1-1D, the horizontal SIW 117 includes a first set of conductive features 121, 122, and 124 of the respective first and second levels L1 and L2 that surround a channel C (e.g., FIGS. 1A-1F) that extends along the second direction Y. In one example, the channel C is filled in one example with the dielectric material of the first level L1. The first transition includes signaling ground traces in the first level L1 that connect the horizontal SIW 117 to the GCPW along the second side 102. As best shown in FIG. 1B, the first transition 131 includes a signal trace 150 and a first ground trace 151 and a second ground trace 152 in the first level L1. The signal trace 150 and the ground traces 151 and 152 connect the horizontal SIW 117 to the GCPW along the second side 102. In the illustrated example, the first ground trace 151 extends along the second direction Y and is spaced apart from a first lateral side of the signal trace 150 along the first direction X. The second ground trace 152 in this example extends along the second direction Y and is spaced apart from an opposite second lateral side of the signal trace 150 along the first direction X. The illustrated conductive structures 119 of the semiconductor die 118 are coupled to respective ones of the traces 150-152 of the first trace layer 111 to electrically couple the receiver circuit of the semiconductor die 118 to the GCPW. A first conductive structure 119 of the semiconductor die 118 is coupled to the signal trace 150, a second conductive structure 119 is coupled to the first ground trace 151, and a third conductive structure 119 is coupled to the second ground trace 152, for example, during flip chip attachment and soldering of the semiconductor die 118 to the multilevel package substrate 110.

As best shown in FIGS. 1A, 1B and 1D, the first trace layer 111 of the first level L1 includes a patterned first conductive trace feature 121 that forms the signal trace 150, the first and second ground traces 151, 152 and a conductive cover feature of the second transition 132. The signal trace 150 in this example has a first portion and a tapered second portion. The first portion of the signal trace 150 has a first width along the first direction X and extends toward the fifth side 105 along the second direction Y from a connection of the first conductive structure 119 of the semiconductor die 118 to the tapered second portion of the signal trace 150. The second portion of the signal trace 150 tapers outward toward the respective fourth and fifth sides 105 and 106 to a larger second width along the first direction X and the second portion extends toward the fifth side 105 along the second direction Y from the first portion to join the conductive cover feature of the second transition 132. The first and second ground traces 151 and 152 each extend toward the fifth side 105 along the second direction Y from a respective connection of the second and third conductive structures 119 of the semiconductor die 118 to the conductive cover feature of the second transition 132. The conductive cover feature of the second transition 132 extends from the second portion of the signal trace 150 and from the first and second ground traces 151 and 152 to the fifth side 105 of the electronic device 100 and covers an opening 160 of the vertical SIW (FIGS. 1A and 1E-1H).

As best shown in FIGS. 1B and 1D, the first via layer 112 of the first level L1 has a patterned first conductive via feature 122 on the first conductive trace feature 121. The first conductive via feature 122 forms lateral sidewalls of the channel C of the horizontal SIW 117 and extends around the opening 160 of the vertical SIW as shown in FIG. 1A. The first conductive via feature 122 has a first portion 153 on (e.g., under) the first ground trace 151 and spaced apart from the signal trace 150. The first via layer 112 has a second portion 154 that is on (e.g., under) the second ground trace 152 and spaced apart from the signal trace 150. Third and fourth portions 155 and 156 of the first conductive via feature 122 extend from the respective first and second portions 153 and 154 along the second direction Y and at angles toward the respective third and fourth sides 103 and 104. As further shown in FIG. 1A, fifth and sixth portions 157 and 158 extend along the second direction Y from the respective third and fourth portions 155 and 156 of the first conductive via feature 122 toward the fifth side 105. A seventh portion 159 of the first conductive via feature 122 extends on (e.g., under) the conductive cover feature of the second transition 132 from the fifth and sixth portions 157 and 158 and surrounds the opening 160 of the vertical SIW. As best shown in FIGS. 1-1C, the second trace layer 113 of the second level L2 includes a patterned second conductive trace feature 124 on (e.g., under) the first conductive via feature 122. A first portion of the second conductive trace feature 124 forms a bottom of the channel C of the horizontal SIW 117. The opening 160 of the vertical SIW extends through a second portion of the second conductive trace feature 124 and is filled in one example with the dielectric material of the respective levels L1, L2 and L3.

FIGS. 1A and 1E-1H illustrate further details of the second transition 132 from the horizontal SIW 117 to the vertical SIW. The vertical SIW includes a second set of conductive features 122, 124, 126, and 128 of the respective first, second and third levels L1, L2, and L3 that surround the opening 160 that extends along the third direction Z to the first side 101 of the multilevel package substrate 110. The second transition 132 and the vertical SIW include the conductive cover feature of the first level L1 that extends over the opening 160 of the vertical SIW. The second transition 132 includes patterned conductive metal features of the first, second and third levels L1-L3. The patterned second conductive via feature 126 of the second via layer 114 extends on (e.g., under) the second trace feature 124 of the second level L2, the patterned third conductive trace feature 128 of the third trace layer 115 extends on (e.g., under) the second conductive via feature 126, and the patterned third conductive via feature 130 of the third via layer 116 extends on (e.g., under) the third conductive trace feature 128. As shown in FIGS. 1A and 1D-1H, the opening 160 of the vertical SIW extends through the second conductive via feature 126, the third conductive trace feature 128, and the patterned third conductive via feature 130 to form the vertical SIW structure. The conductive cover feature of the first level L1 extends over the opening 160 of the vertical SIW. The vertical SIW provides the opening 160 that extends along the bottom or first side 101 of the multilevel package substrate 110, with an upper end of the opening 160 covered by the conductive cover feature of the second transition 132 of the first conductive trace feature 121, and the opening extends to the end of the channel C of the horizontal SIW 117 to form the vertical to horizontal second transition 132.

The illustrated example provides an integrated waveguide for coupling signals between the lower end of the vertical SIW along the first side 101 of the multilevel package substrate 110 and circuitry of the semiconductor die 118 connected to the GCPW along the second side 102, with the transitions 131 and 132 operatively coupling respective ends of the horizontal SIW 117 to the GCPW and the vertical SIW. In one implementation, the electronic device 100 is a mm-wave radar receiver configured to operate as a receiver in a radar receiver system (e.g., FIG. 1). The waveguide structure of illustrated example is sized in one implementation for operation in a specific range of frequencies, such as approximately 140 to 220 GHz per the WR5 EIA standard, the WG30 RSCS standard or the IEC R1800 standard. In other example implementations, the waveguide features of the multilevel package substrate 110 can be tailored for operation as a waveguide or electromagnetic feed line that is used for high frequency signals according to any particular standard and frequency band. The integration of the waveguide in the multilevel package substrate 110 advantageously facilitates conduction of microwave energy at lower loss than coaxial cables for microwave communications, radars and other high frequency applications.

As shown in FIGS. 1A and 1E, the wide portion of the waveguide channel C has a length dimension 161 of approximately 916 μm along the second direction Y, and a channel width dimension 162 of approximately 570 μm along the first direction X. As shown in FIG. 1D, the first and second portions 153 and 154 of the first conductive via feature 122 in the first portion of the conductive signal trace 150 have a length dimension 163 of approximately 200 μm along the second direction Y, and the second portion of the signal trace 150 as a length dimension 164 of approximately 100 μm. As further shown, the tapered second portion of the signal trace 150 as a lateral width dimension 165 of approximately 520 μm along the first direction X. As further shown in FIG. 1G, the opening 160 of the vertical SIW as a length dimension 166 of approximately 714 μm along the second direction Y and a width dimension 167 of approximately 1345 μm at the beginning of the opening through the seventh portion 159 of the first conductive via feature 122. As also shown in FIG. 1G, the opening 160 has a lateral width dimension 168 of approximately 1295 μm along the first direction X at the second via layer 114. As further shown in FIG. 1H, the opening 160 as a length dimension 169 of approximately 648 μm along the second direction Y at the third via layer 116. Other suitable dimensions can be used in different implementations, for example, to accommodate operation in different frequency bands and/or according to other standards, in which the waveguide provides a certain minimum cross section relative to the wavelength of the signal to facilitate signal propagation.

Figure 2:
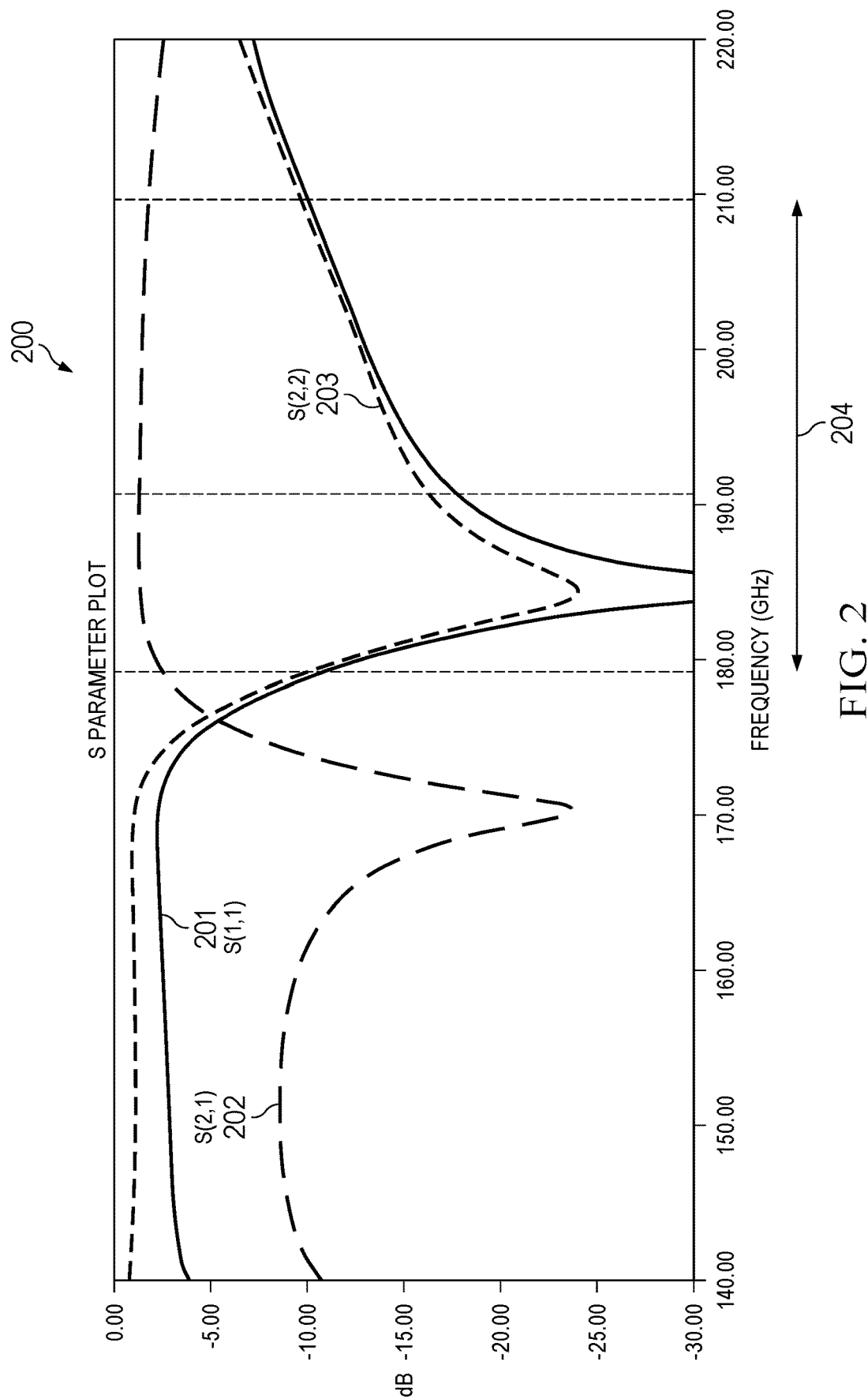
FIG. 2 is a graph of return loss as a function of frequency in the WR5 band for the second transition from the vertical SIW to the horizontal SIW in one implementation of the electronic device of FIGS. 1-1H.

FIGS. 2-2E illustrate example simulated performance of one implementation of the second transition 132 in the electronic device 100 for operation in the WR5 band. FIG. 2 shows a graph 200 of return loss as a function of frequency in the WR5 band for the second transition 132 from the vertical SIW to the horizontal SIW 117 in one implementation of the electronic device 100. The graph 200 includes S-parameter curves 201-203 with a first curve 201 showing S(1,1) return loss, a second curve 202 showing S(2,1) return loss, and a third curve 203 showing S(2,2) return loss performance. The graph 200 also indicates a desired operating frequency band 204 corresponding to the WR5 band.

Figure 2A:
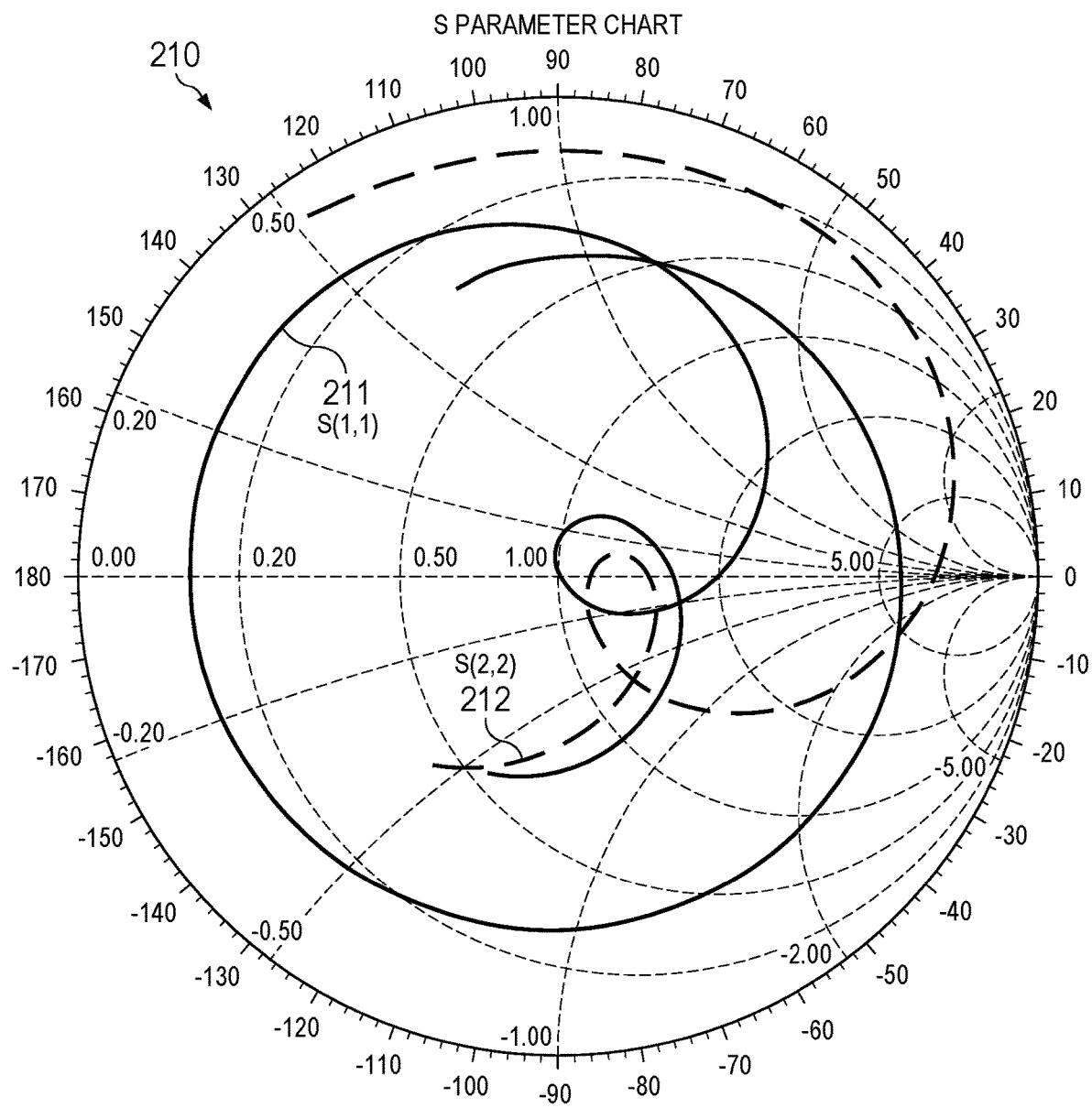
FIG. 2A is a Smith chart representation of return loss as a function of frequency in the WR5 band for the second transition from the vertical SIW to the horizontal SIW in one implementation of the electronic device of FIGS. 1-1H.

As shown in FIG. 2, the second transition 132 and the vertical and horizontal waveguide structures of the multilevel package substrate 110 provide at least 10 DB return loss performance within the WR5 band 204. FIG. 2A shows a Smith chart 210 of the return loss performance of the example electronic device 100 as a function of frequency in the WR5 band for the second transition 132, including a first curve 211 that shows S(1,1) performance and a second curve 212 that shows S(2,2) performance of the second transition 132.

The attenuation and return loss of the second transition 132 in this example demonstrates performance benefits of a direct vertical SIW to horizontal SIW transition with a horizontal SIW cutoff frequency at 177 GHz. In this example, the vertical SIW is implemented by the conductive structures surrounding the opening 160 including conductive features of the second and third trace and via layers with simulated dimensions 1295 um×648 um (e.g., 51 mils×25.5 mils) targeting a standard WR5 band air filled waveguide. In certain limitations, the second transition 132 can be tailored or optimized using the layer 2 opening and a gap between the side walls to match the impedance and guide waves to rotate them 90 degrees towards the horizontal SIW 117. This design example provides 30 GHz of −10 dB bandwidth achieved with minimum and maximum in-band attenuation of 1.31 dB and 2.55 dB, respectively. In certain system implementations, the solder 143 and the corresponding PCB trace feature 141 (e.g., FIGS. 1, 1A, 1E and 1F) have the same or similar dimensions to match at least approximately the first and second direction dimensions of the opening 160 of the third level L3.

Figure 2B:
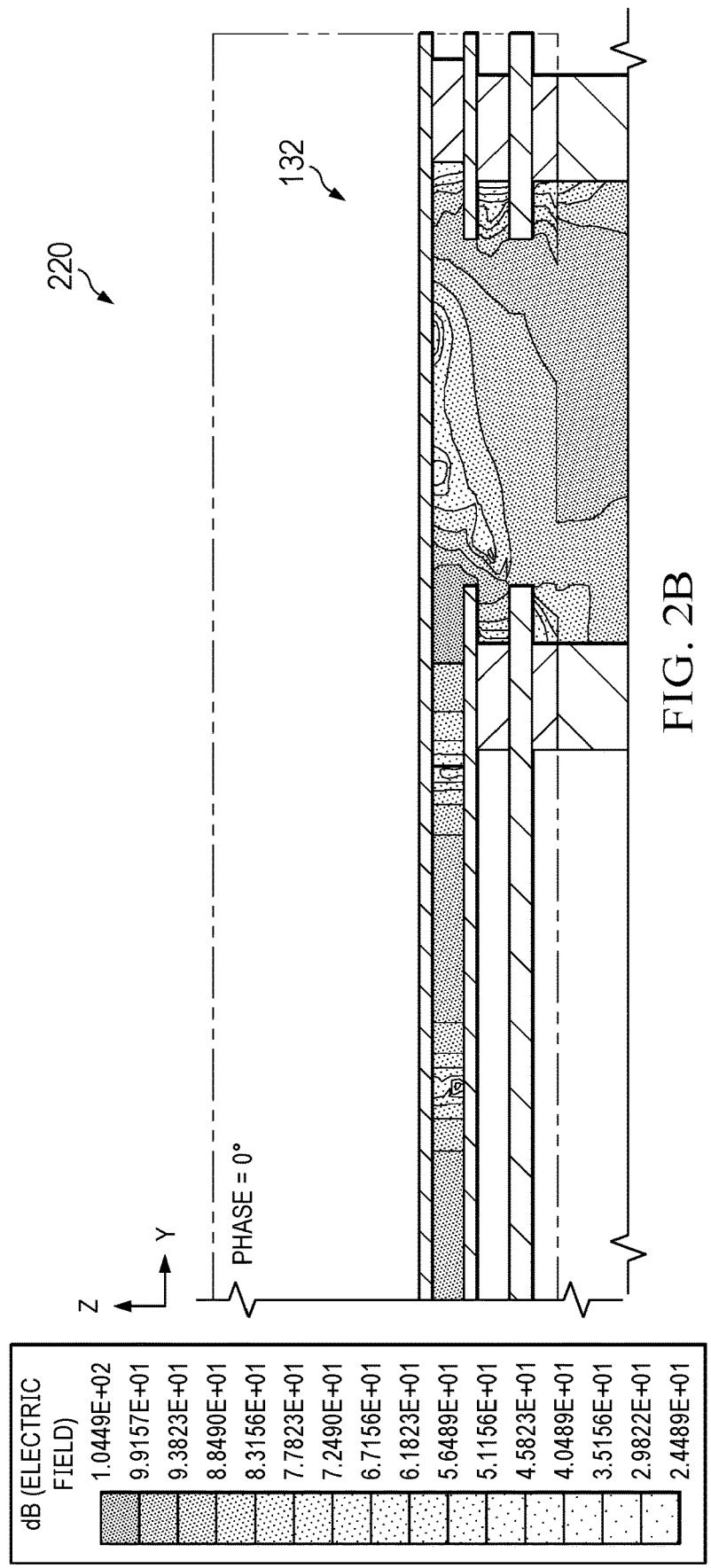
FIG. 2B is a partial side view of simulated signal propagation in the WR5 band for the second transition from the vertical SIW to the horizontal SIW in one implementation of the electronic device of FIGS. 1-1H.
Figure 2C:
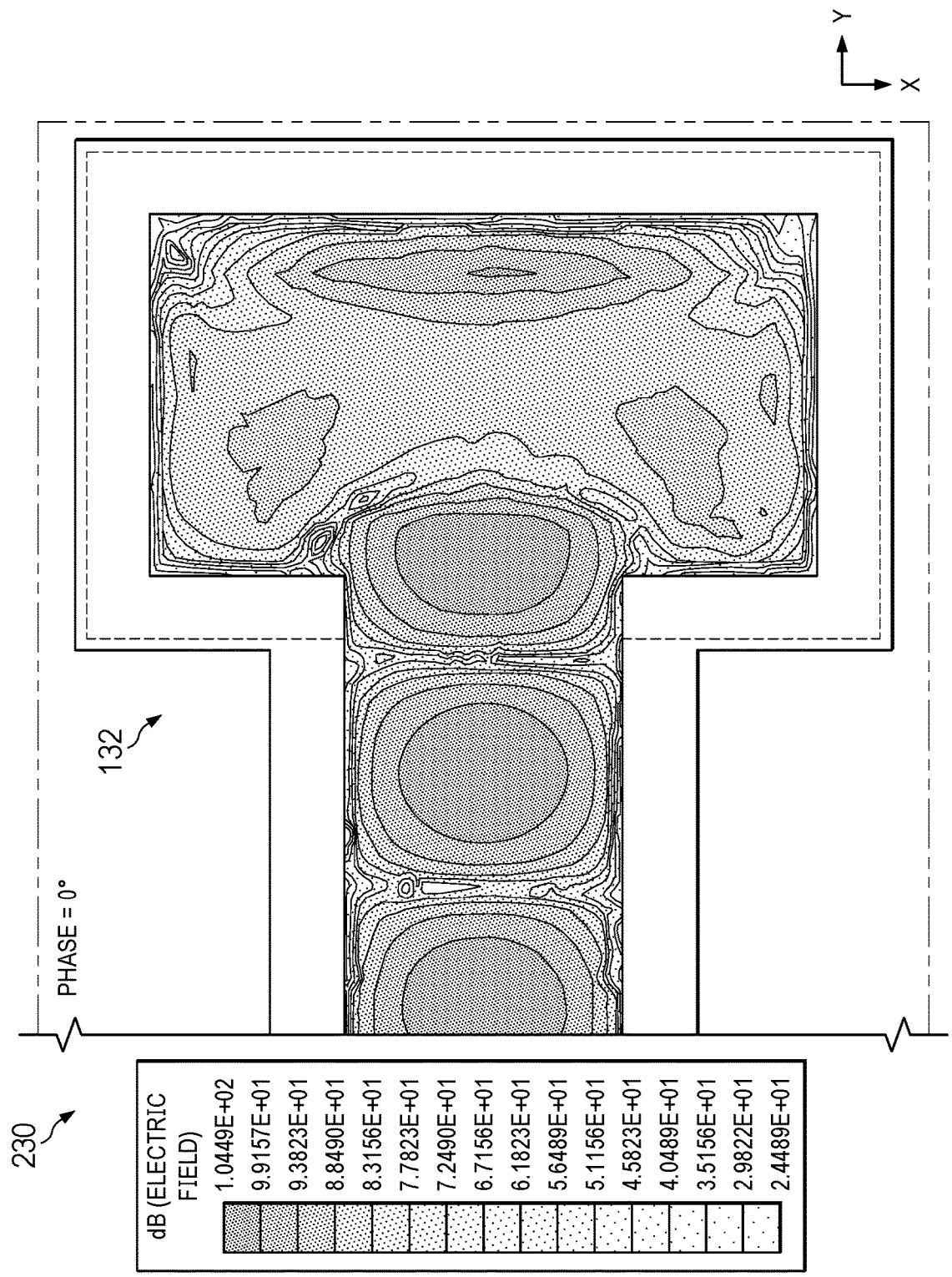
FIG. 2C is a partial top view of simulated signal propagation in the WR5 band for the second transition from the vertical SIW to the horizontal SIW in one implementation of the electronic device of FIGS. 1-1H.

FIG. 2B shows a partial side view 220 of simulated signal propagation in the WR5 band for the second transition 132 from the vertical SIW to the horizontal SIW in the example implementation of the electronic device 100, and FIG. 2C shows a partial top view 230 of simulated signal propagation in the WR5 band for the second transition 132. In this example, the horizontal and vertical SIWs are operated in $TEM_{10}$ mode. As shown in FIGS. 2B and 2C, the second transition 132 provides vertical to horizontal signal propagation in the simulated WR5 band for signals generated by the host PCB and consumed by the circuitry of the semiconductor die with little or no surface wave lateral leakage on PCB ground due to soldered transition. In addition, the simulated example shows little or no leakage in the stack-up layers of the multilevel package substrate 110 due to solid wall structures and the waveguide is completely isolated. For this example, moreover, a table 240 in FIG. 2D shows vertical SIW impedance values at different frequencies in the WR5 band, and a table 250 in FIG. 2E shows horizontal SIW impedance values at different frequencies in the WR5 band for this simulated implementation of the electronic device 100, where the impedance looking into the vertical SIW (table 240) varies from approximately 431Ω to approximately 286Ω whereas, the impedance looking into horizontal SIW 117 (table 250) varies from approximately 105Ω to approximately 25Ω in the simulated frequency band.

Figure 3:
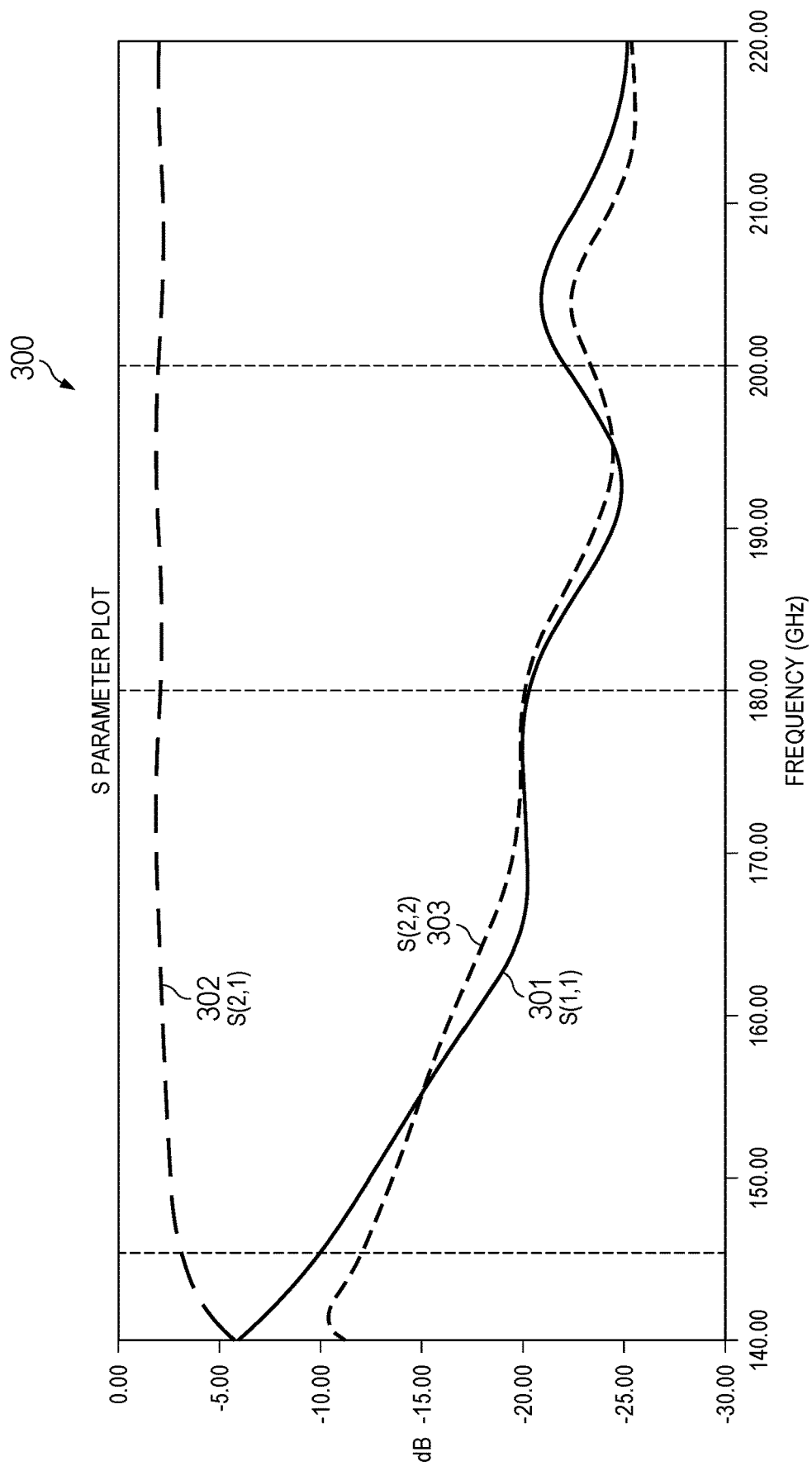
FIG. 3 is a graph of return loss as a function of frequency in the WR5 band for the first transition from the horizontal SIW to the GCPW in one implementation of the electronic device of FIGS. 1-1H.
Figure 3A:
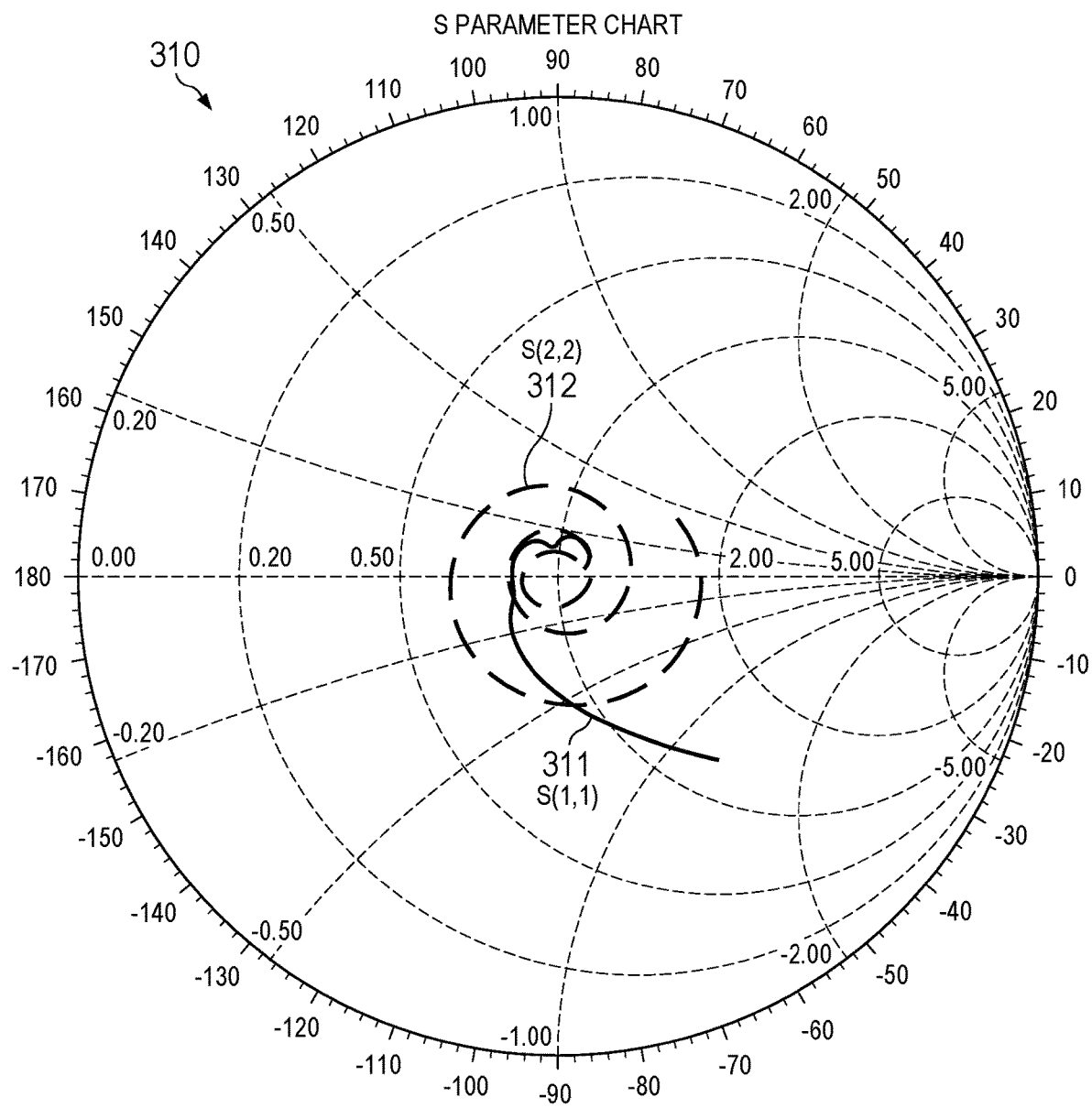
FIG. 3A is a Smith chart representation of return loss as a function of frequency in the WR5 band for the first transition from the horizontal SIW to the GCPW in one implementation of the electronic device of FIGS. 1-1H.
Figure 3B:
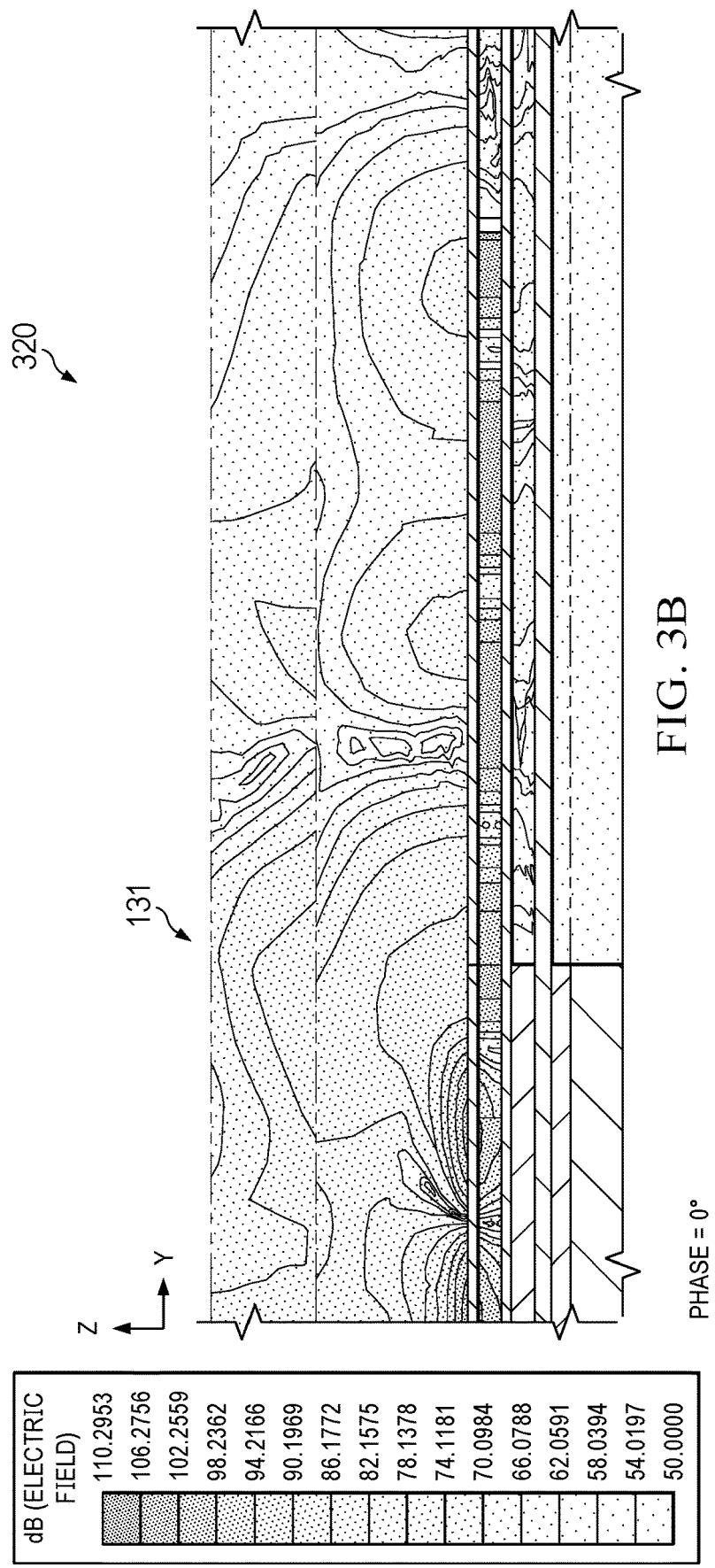
FIG. 3B is a partial side view of simulated signal propagation in the WR5 band for the first transition from the horizontal SIW to the GCPW in one implementation of the electronic device of FIGS. 1-1H.
Figure 3C:
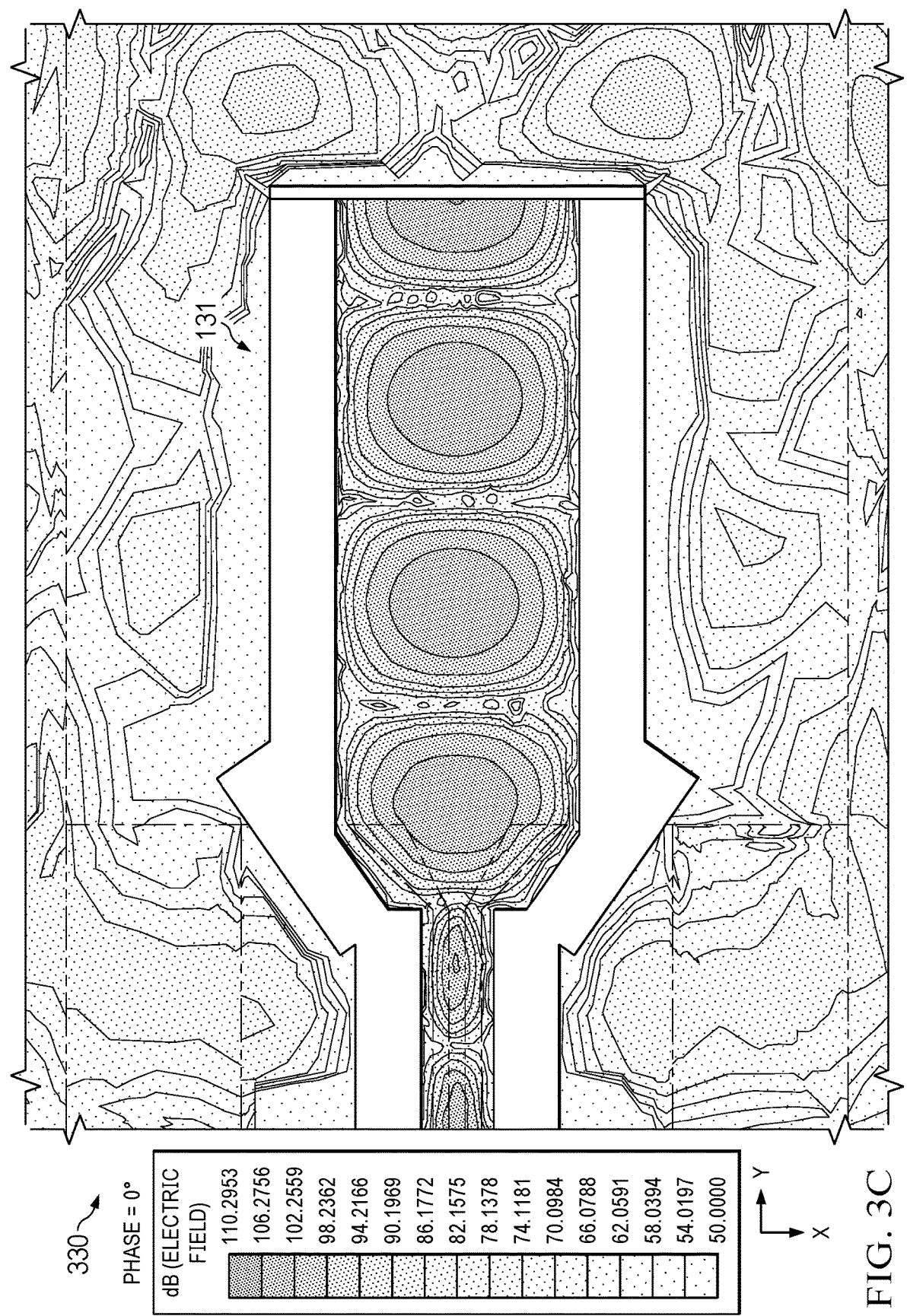
FIG. 3C is a partial top view of simulated signal propagation in the WR5 band for the first transition from the horizontal SIW to the GCPW in one implementation of the electronic device of FIGS. 1-1H.

FIGS. 3-3C illustrate example simulated performance of one implementation of the first transition 131 between the horizontal SIW 117 and the GCPW of the electronic device 100 for operation in the WR5 band. FIG. 3 shows a graph 300 of return loss as a function of frequency in the WR5 band for the first transition 131 from the horizontal SIW to the GCPW, including S-parameter curves 301-303 with a first curve 301 showing S(1,1) return loss, a second curve 302 showing S(2,1) return loss, and a third curve 303 showing S(2,2) return loss performance. FIG. 3A shows a Smith chart 310 of return loss as a function of frequency in the WR5 band for the first transition 131, including a first curve 311 that shows S(1,1) performance and a second curve 312 that shows S(2,2) performance of the first transition 131. In this example, the length of the horizontal SIW 117 is approximately 941 um and the GCPW with the first transition 131 is approximately 500 um. In one implementation, the impedance of GCPW transmission line is designed to be 50Ω with width and ground spacing of 35 um. The simulated first transition 131 in this example shows a wide band performance with −10 dB bandwidth of approximately 74 GHz with good matching performance as seen in FIG. 3A. In this example, a maximum attenuation of approximately 3.16 dB is observed at 145.4 GHz and a minimum attenuation of approximately 1.98 dB is observed at 200 GHz.

FIG. 3B shows a partial side view 320 of simulated signal propagation in the WR5 band for the first transition 131 from the horizontal SIW 117 to the GCPW, and FIG. 3C shows a partial top view 330 of simulated signal propagation in the WR5 band for the first transition 131. The simulated signal propagation in this example demonstrates that solid wall structures of the multilevel package substrate 110 help to achieve near to no leakage in the horizontal SIW 117 observed at the GCPW transition 131. In various implementations, lateral direction leakage may be possible due to radiations from the wide slot opening at the GCPW transition 131, which can reduce the efficiency of the transition.

Figure 4:
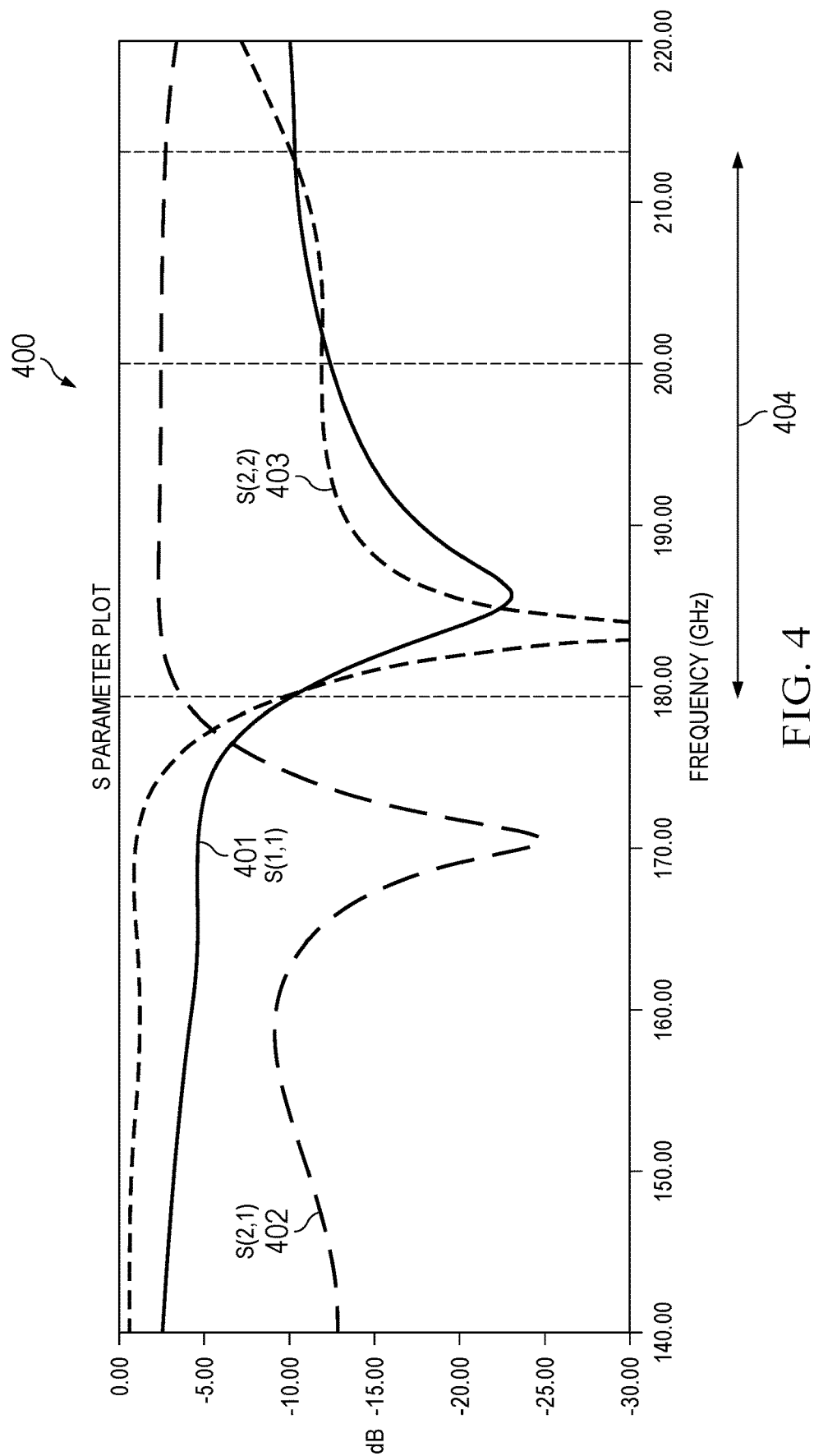
FIG. 4 is a graph of combined return loss as a function of frequency in the WR5 band for the first and second transitions in one implementation of the electronic device of FIGS. 1-1H.
Figure 4A:
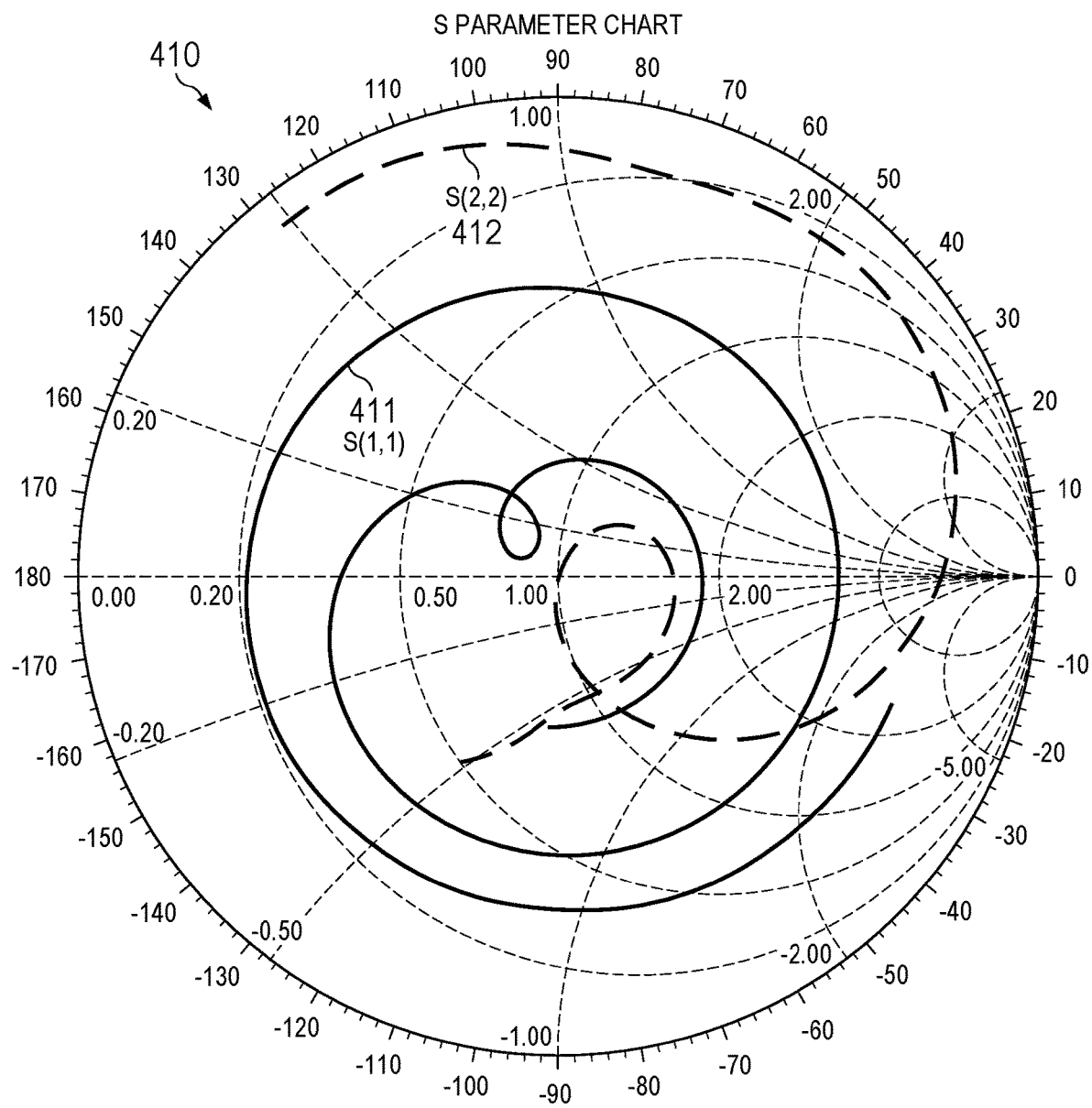
FIG. 4A is a Smith chart representation of combined return loss as a function of frequency in the WR5 band for the first and second transitions in one implementation of the electronic device of FIGS. 1-1H.
Figure 4B:
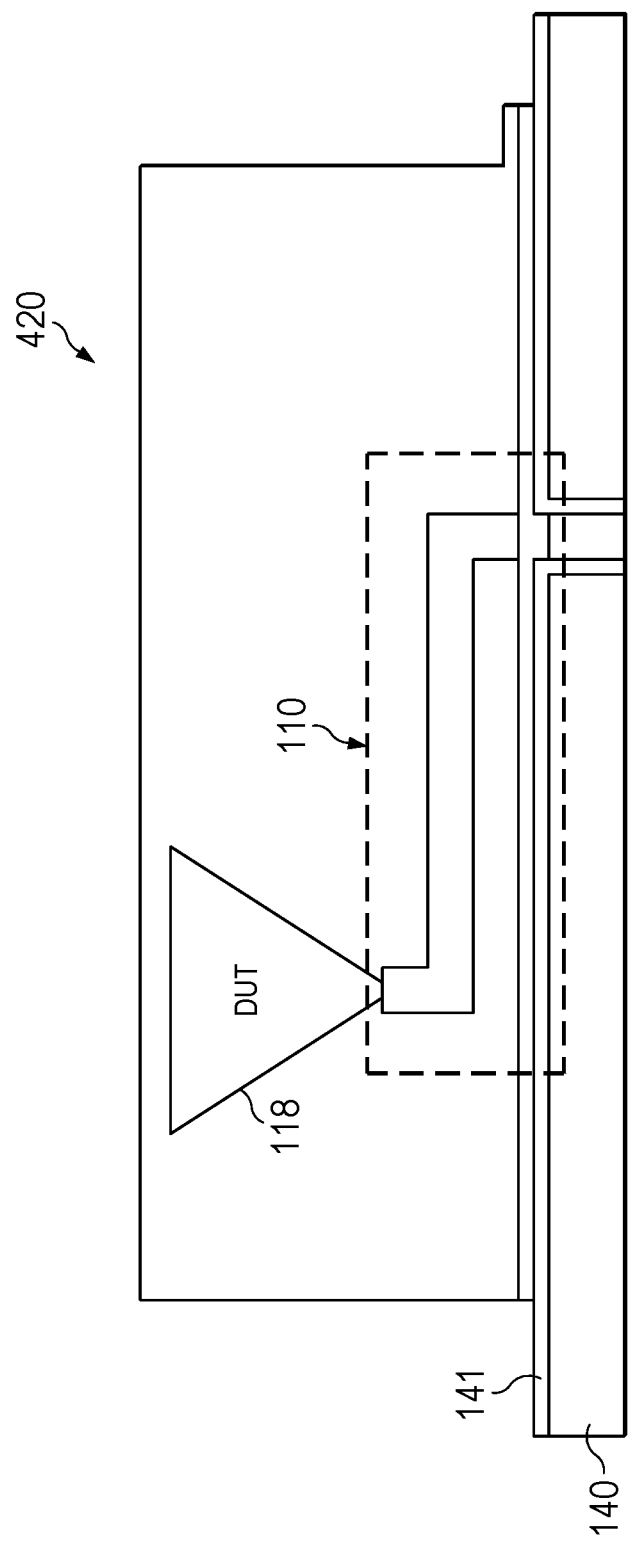
FIG. 4B is a simplified side view of a system with an implementation of the electronic device of FIGS. 1-1H.

FIGS. 4 and 4A a show respective graphs 400 and 410 of combined return loss as a function of frequency in the WR5 band for the first and second transitions 131 and 132 in one implementation of the electronic device 100. The graph 400 in FIG. 4 shows return loss as a function of frequency in the WR5 band for the first and second transitions 131 and 132 and includes S-parameter curves 401-403 with a first curve 401 showing S(1,1) return loss, a second curve 402 showing S(2,1) return loss, and a third curve 403 showing S(2,2) return loss performance. The graph 400 also indicates a desired operating frequency band 404 corresponding to the WR5 band. As shown in FIG. 4, the integrated transition can achieve approximately 33 GHz (e.g., 41.25%) of −10 dB bandwidth with maximum in band attenuation of approximately 3.74 dB and a minimum in band attenuation of approximately 2.48 dB. FIG. 4A shows a Smith chart 410 of the return loss performance of the example electronic device 100 as a function of frequency in the WR5 band for the first and second transitions 131 and 132, including a first curve 411 that shows S(1,1) performance and a second curve 412 that shows S(2,2) performance. FIG. 4B shows a simplified side view of a system 420 with an implementation of the electronic device 100 with the semiconductor die 118 including a device under test (DUT) representing the modeled or simulated system as a millimeter wave radar receiver.

Referring also to FIGS. 5-12, FIG. 5 shows a method 500 of fabricating an electronic device and FIGS. 6A-12 illustrate the example electronic device 100 undergoing fabrication processing according to the method 500. The method 500 includes forming a multilevel package substrate 110 at 501-503. In this example, electroplating steps are used to form patterned metal trace features and patterned metal via features, followed by compression molding of dielectric (e.g., insulator) material and planarization for each level of the multilevel package substrate 110 of FIGS. 1-1G described above. The multilevel package substrate 110 provided and/or manufactured at 501-503 in FIG. 5 includes the above-described features with multiple trace and via levels. In one implementation, the multilevel package substrate 110 is fabricated in a separate fabrication process and is provided as an input component (e.g., a panel or strip with rows and columns of unit areas) to a different manufacturing process for packaging along with the semiconductor die 118. In another implementation, a single fabrication process creates the multilevel package substrate 110 and includes further processing to manufacture packaged semiconductor devices such as the electronic device 100.

FIGS. 6A-8E show the multilevel package substrate 110 undergoing fabrication processing as a panel or array with multiple unit areas. At 501 in FIG. 5, the method 500 includes forming the first level (L1) of the multilevel package substrate 110, with a metal trace feature forming the GCPW signal and ground traces 150-152 and the conductive cover structure of the second transition 132. The first level fabrication at 501 includes forming the first trace layer 111 with the patterned first conductive trace features 121. In the illustrated example, the multilevel package substrate fabrication at 501-503 includes forming the first level L1 with patterned conductive metal trace and via features 121 and 122 and a dielectric layer 123 on a carrier structure 602, and subsequently forming the second level L2 on the first level at 502 and forming the third level L3 on the second level L2, after which the carrier structure is removed from the first level L1. Following the fabrication of multiple rows and columns of the substrate panel array, the panel array is used as a component in the fabrication of a panel or array of the electronic devices 100.

Figure 6A:
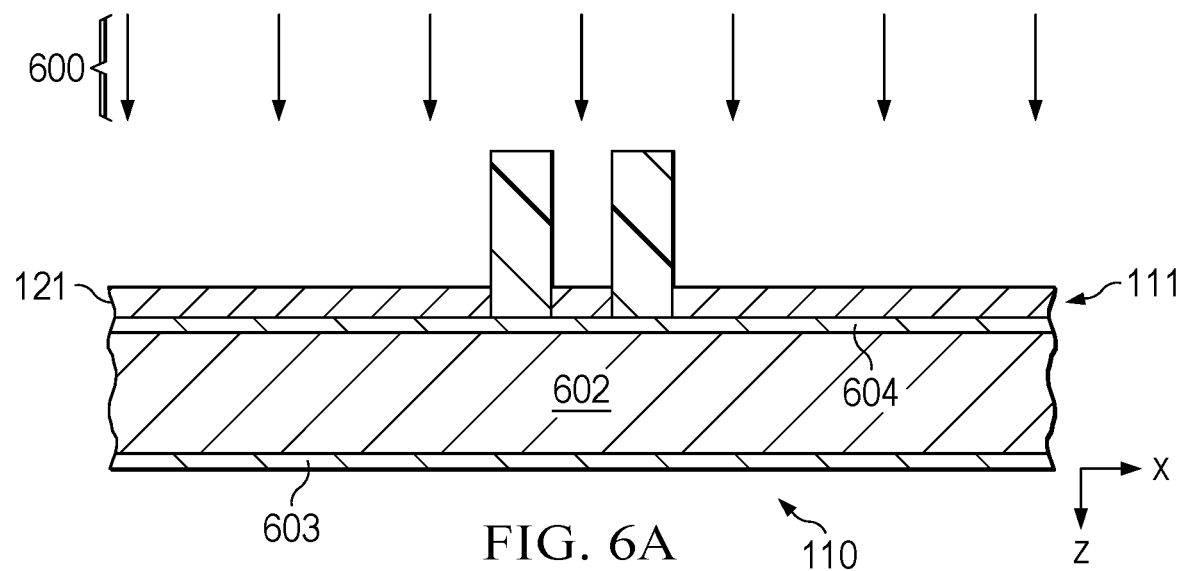
FIGS. 6A-12 are partial sectional side elevation views of the electronic device of FIGS. 1-1H undergoing fabrication processing according to the method of FIG. 5.

FIG. 6A shows a partial sectional side elevation view, in which the first level formation at 501 starts with forming the first trace layer 111 to provide a metal trace forming a top of a waveguide using a stainless-steel or other suitable carrier 602 (FIG. 6A), such as a panel or strip with multiple prospective multilevel package substrate sections or unit areas, one of which is shown in FIG. 6. The illustrated example includes conductive metal features 121 formed by an electroplating process 600, where the conductive metal features 121 are or include copper. In other implementations, a different conductive metal can be used, such as aluminum or metals that include aluminum, etc. The carrier structure 602 in the example of FIG. 6A includes thin copper seed layers 603 and 604 formed by a blanket deposition process (not shown) such as chemical vapor deposition (CVD) on the respective bottom and top sides of the carrier structure 602 to facilitate subsequent electroplating via the process 600. The electroplating process 600 deposits copper onto the upper copper seed layer 604 in the portions of the topside of the carrier structure that are exposed through a patterned plating mask to form the first patterned conductive trace features 121 in the first level L1.

Figure 6B:
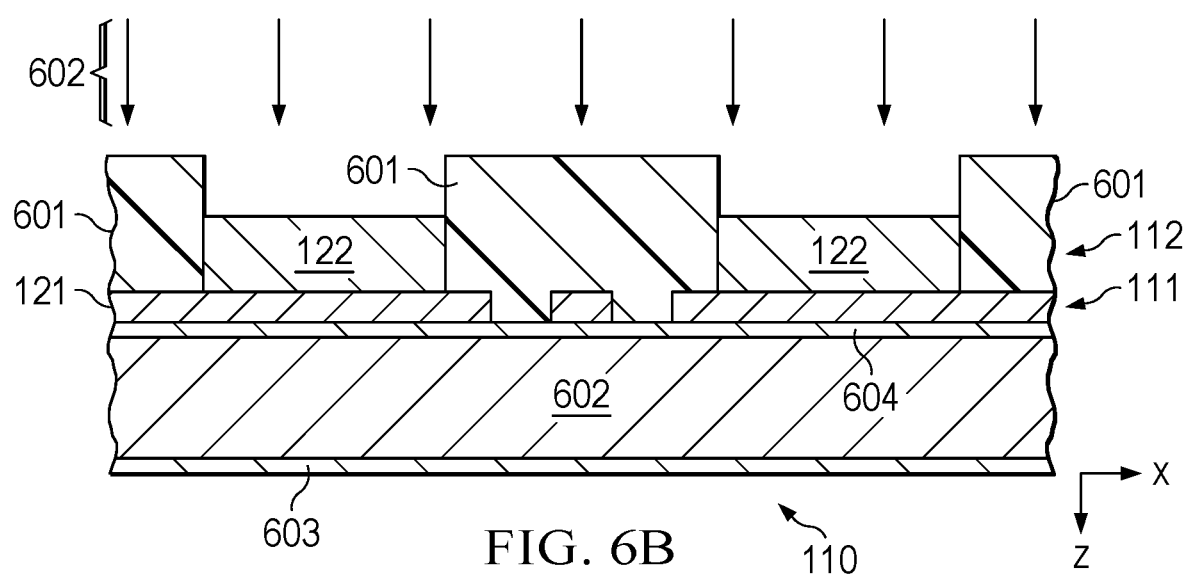

The first level formation continues with forming the first via layer 112 with the first patterned first conductive via features 122 on the first conductive trace features 121. FIG. 6B shows a partial sectional side elevation of the multilevel package substrate undergoing another electroplating process 602 that forms the patterned first via layer 112 with the first conductive via features 122 in the first level of the multilevel package substrate 110 using a patterned plating mask 601.

Figure 6C:
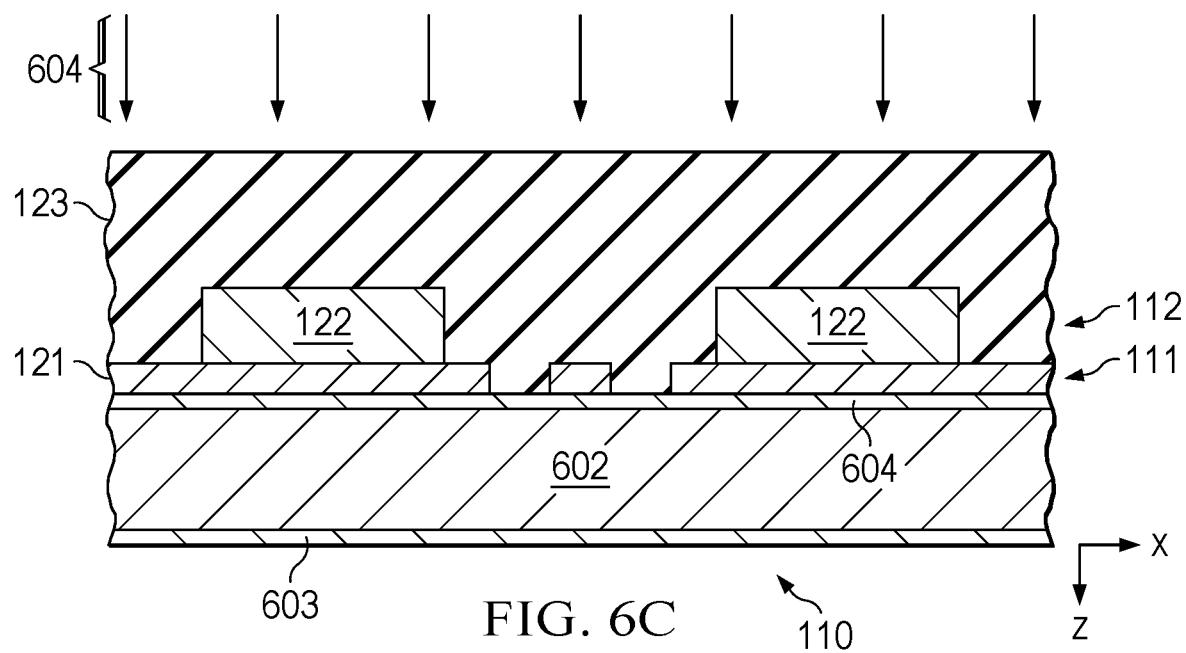
Figure 6D:
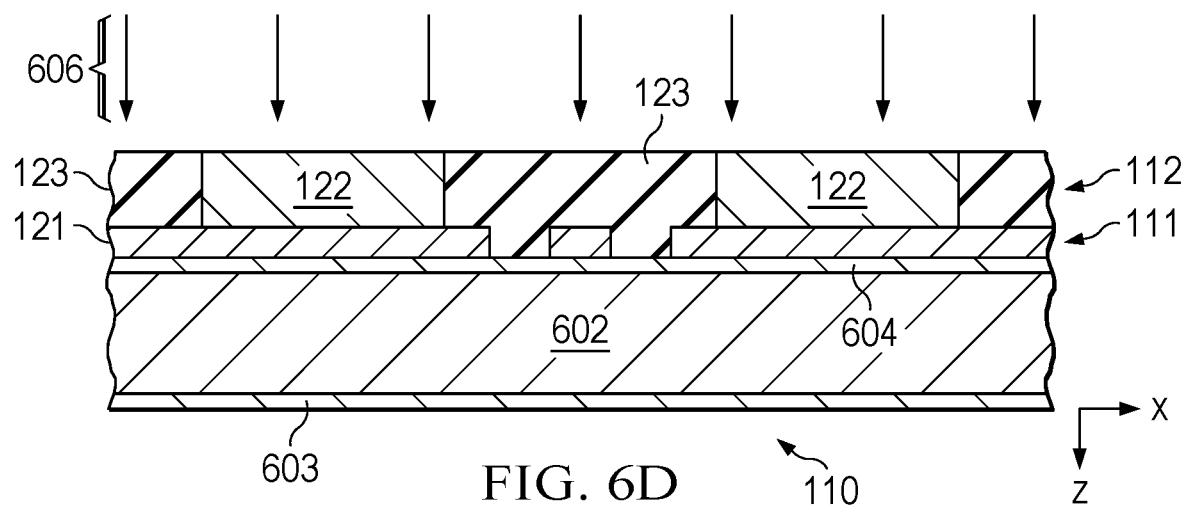

As further shown in FIGS. 6C-6D, the first level formation also includes performing a dielectric compression molding process 604 that forms the first dielectric layer 123 on and between the first conductive trace features 121 and between the first conductive via features 122. In other implementations, a different dielectric layer formation process can be used, such as a deposition process (not shown). In one example, as shown in FIG. 6C, a compression molding process 604 is performed that forms the molded dielectric layer features 123 in FIG. 6C to an initial thickness that covers portions (not shown) of the first conductive trace features 121 and the first conductive via features 122. A grinding or other planarization process 606 is performed in FIG. 6D, which grinds upper portions of the molded dielectric material 123 and exposes the upper portions of the first conductive via features 122 as shown in FIG. 6D. In another example, a chemical etch is used. In a further example, a chemical mechanical polishing (CMP) process is used.

Figure 5:
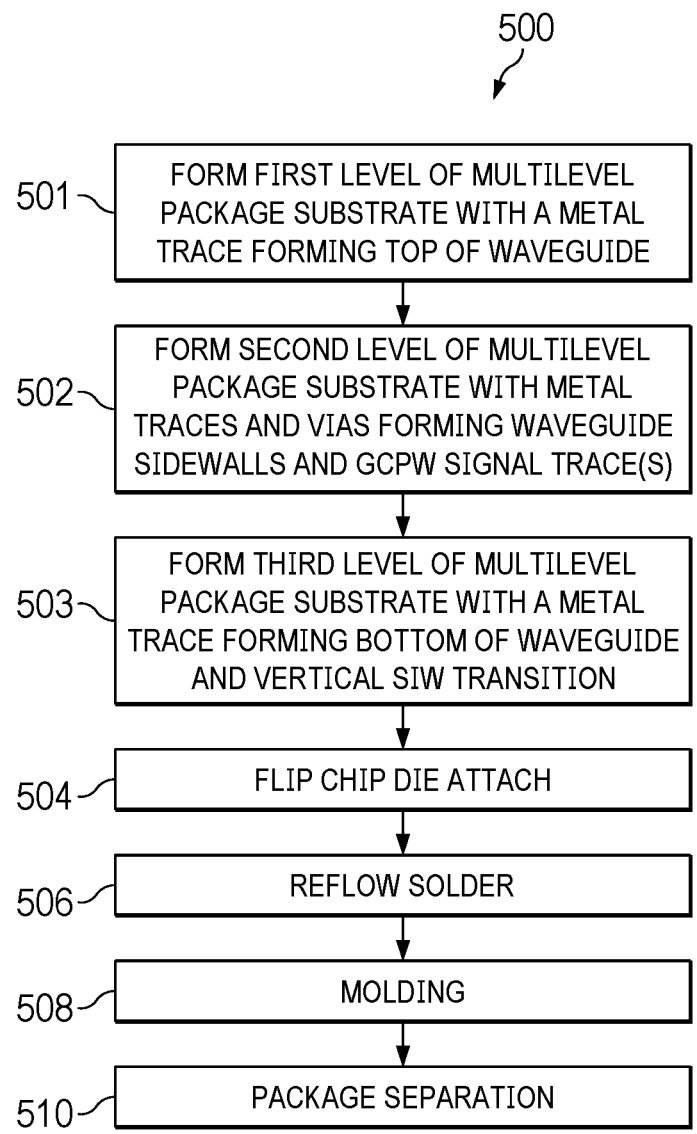
FIG. 5 is a flow diagram of a method of fabricating an electronic device.
Figure 7A:
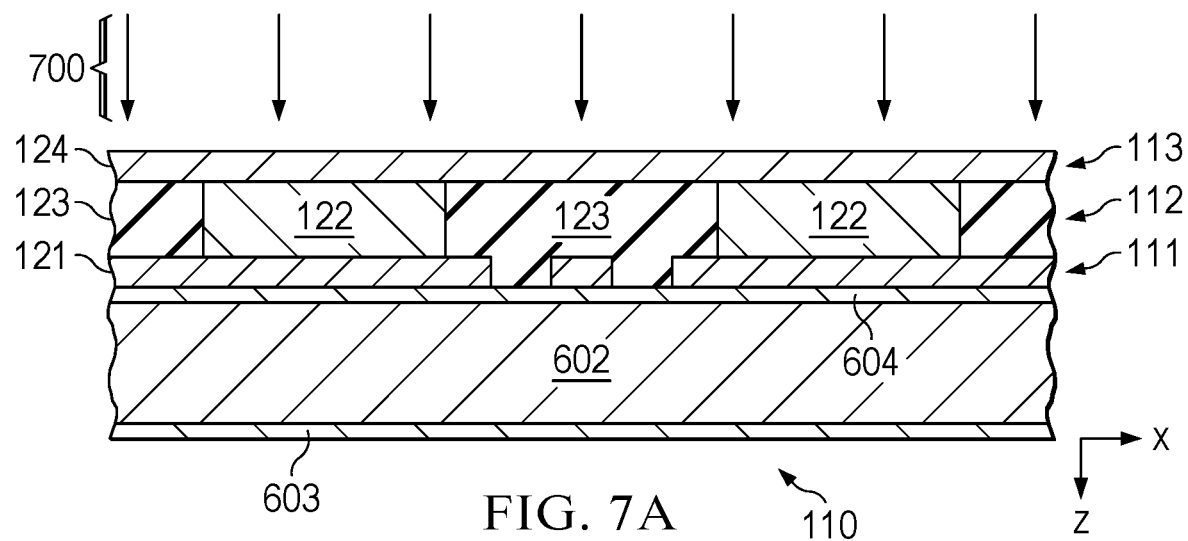
Figure 7B:
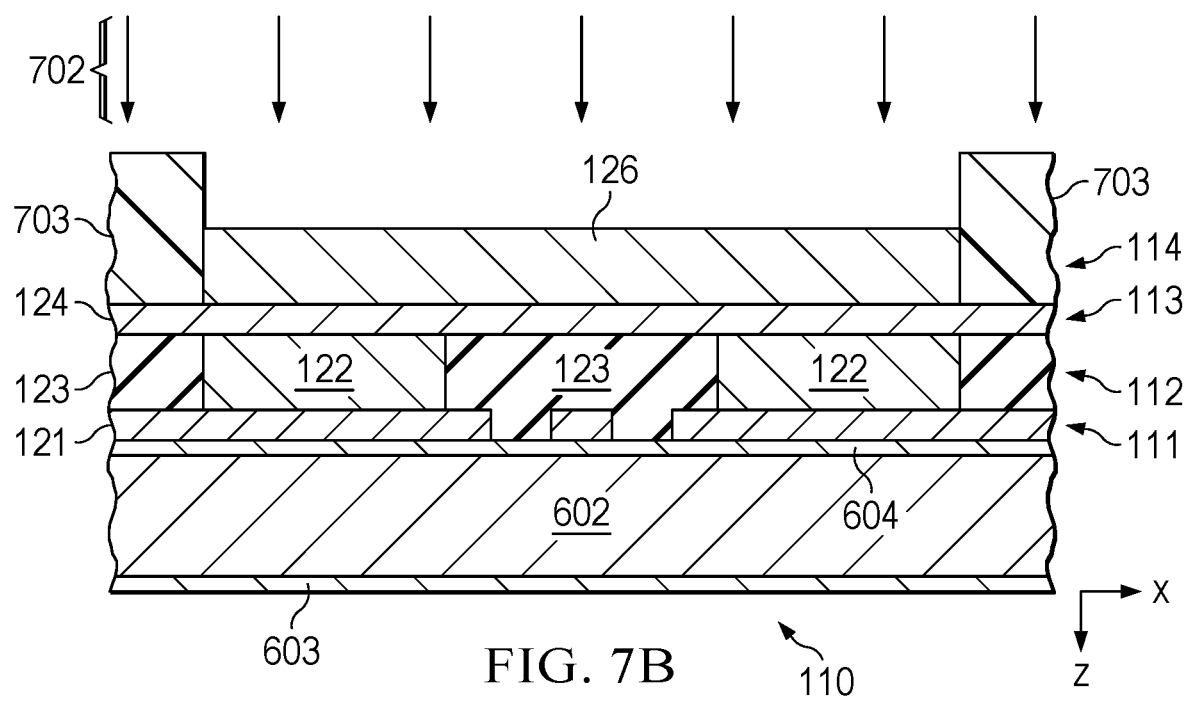
Figure 7C:
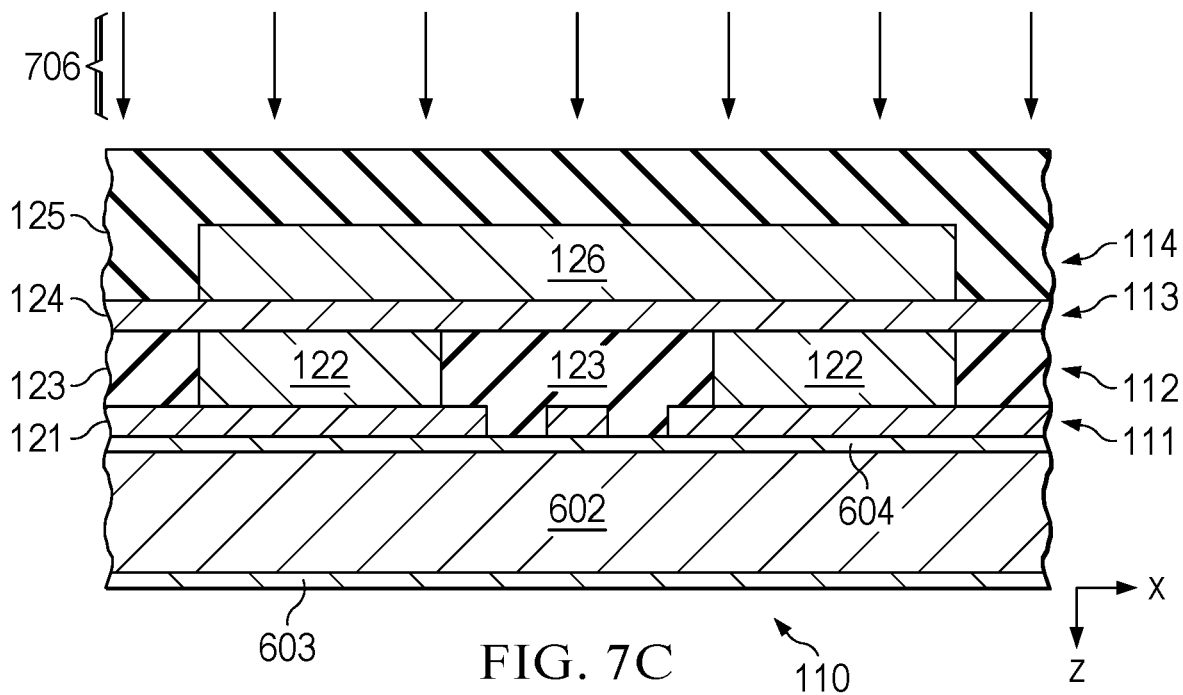
Figure 7D:
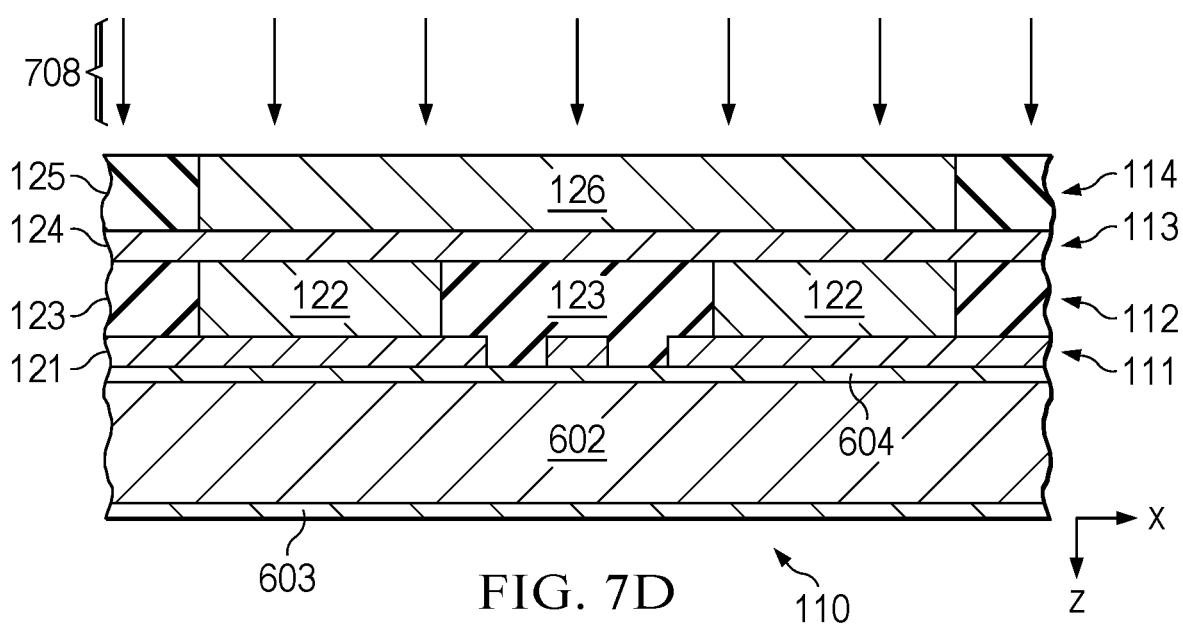

The method 500 of FIG. 5 continues at 502 with forming the second level of the multilevel package substrate 110 with metal traces and vias forming portions of the waveguides and transitions. FIGS. 7A-7D show formation of the second level on the first level, including forming the second trace layer 113 via another copper electroplating process 700 using a plating mask (not shown in the illustrated portion of FIG. 7A). The electroplating process 700 forms the electroplated second trace layer 113 that includes the patterned second conductive trace features 124 on the first conductive via features 122 and on the first dielectric layer of the first level. The second level formation continues in FIG. 7B with another electroplating process 702 using a further plating mask 703. The electroplating process 702 forms the second via layer 114 including the patterned second conductive via features 126 on the second conductive trace features 124. As further shown in FIGS. 7C-7D, the second level formation also includes performing another dielectric compression molding process 706 in FIG. 7C that forms the second dielectric layer 125 on and between the second conductive trace features 124 and between the second conductive via features 126. In other implementations, a different dielectric layer formation process can be used, such as a deposition process (not shown). The compression molding process 704 forms the second dielectric layer features 125 in FIG. 7C to an initial thickness that covers the second conductive trace features 124 and the second conductive via features 126. In FIG. 7D, a grinding or other planarization process 708 is performed that grinds upper portions of the molded dielectric material 125 and exposes the upper portions of the second conductive via features 126. In another example, a chemical etch is used. In a further example, a chemical mechanical polishing (CMP) process is used.

Figure 8A:
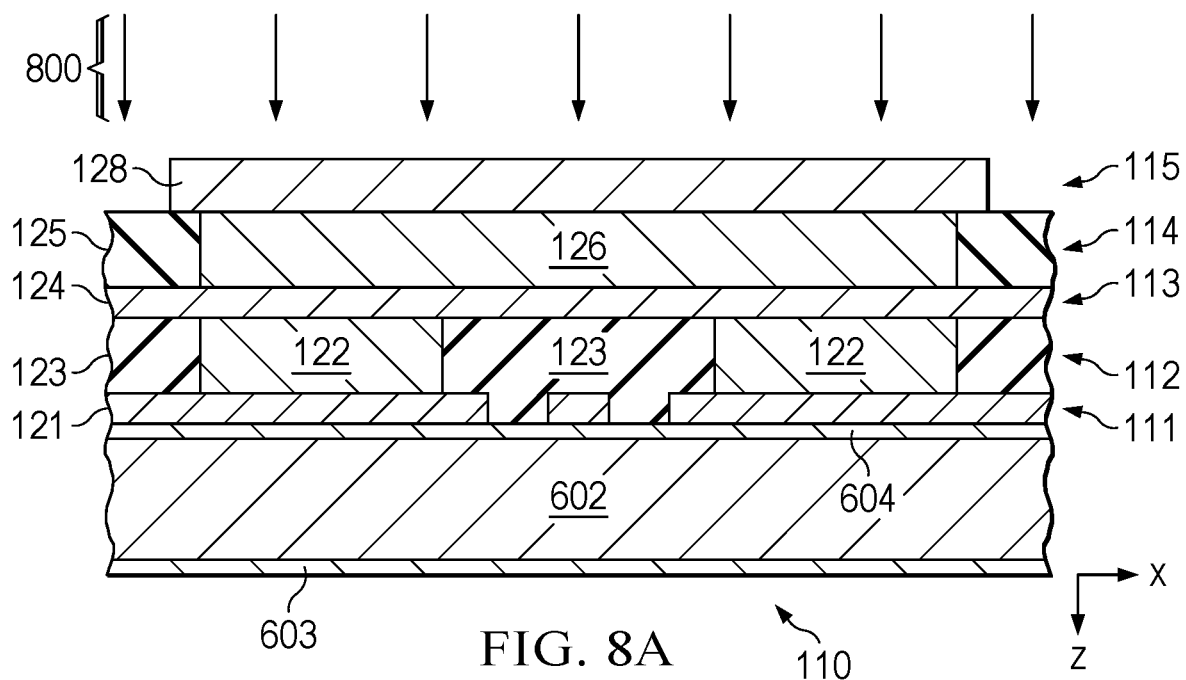
Figure 8B:
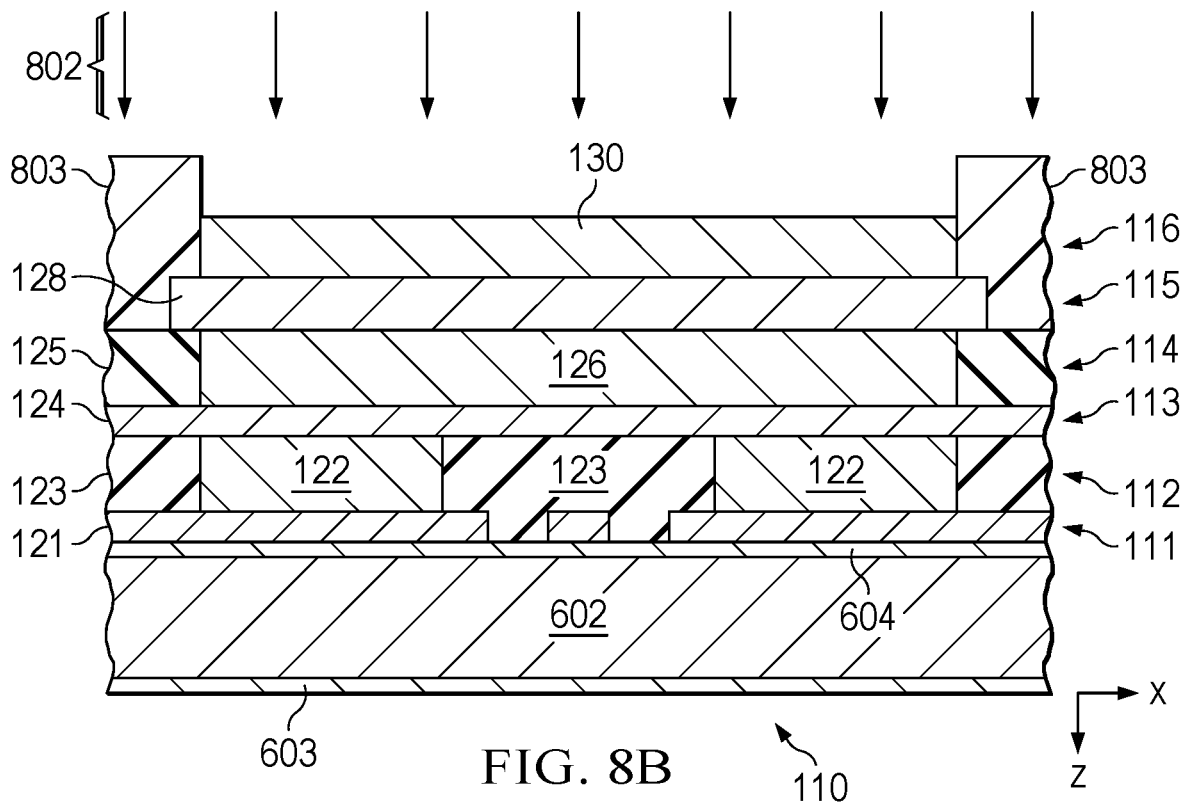
Figure 8C:
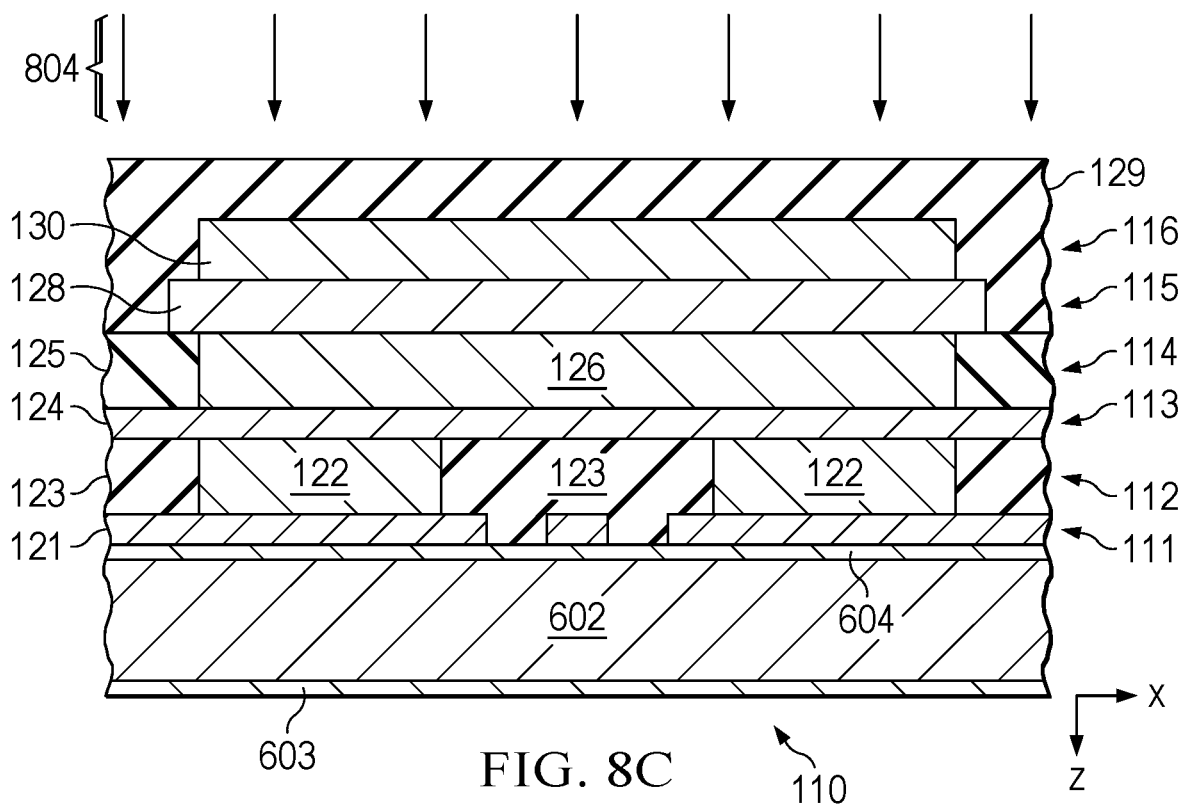
Figure 8D:
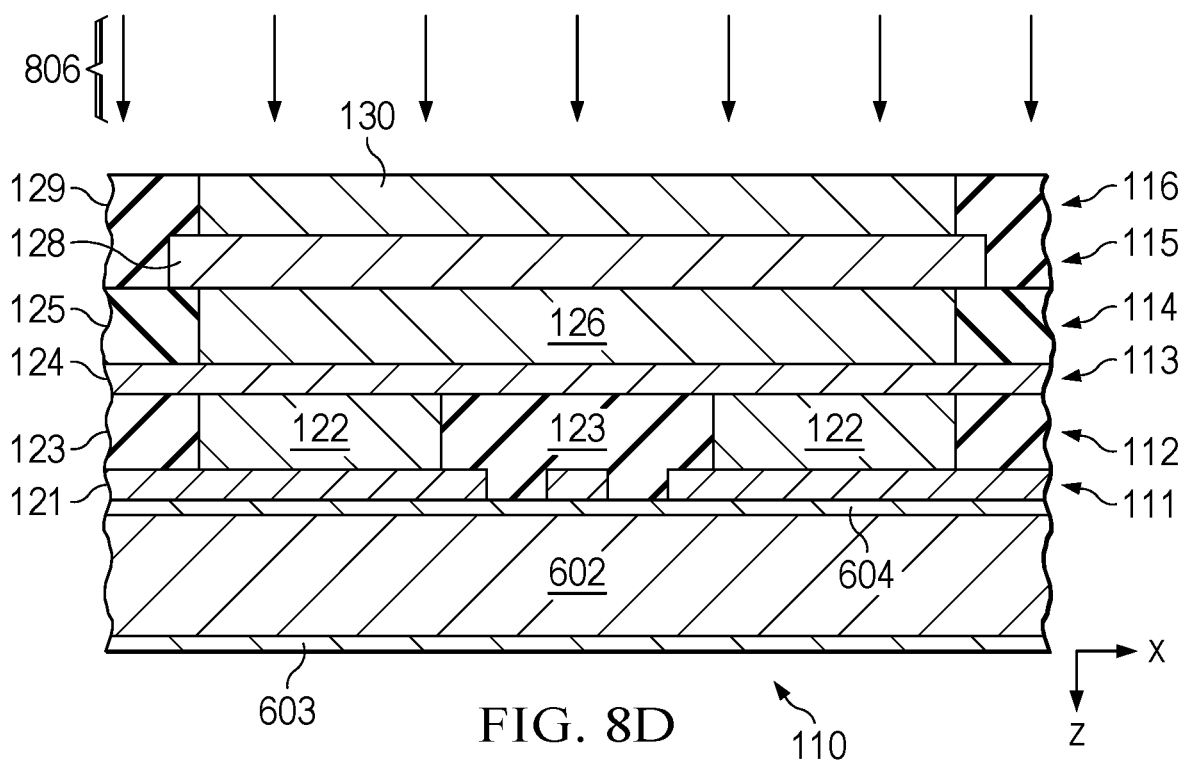
Figure 8E:
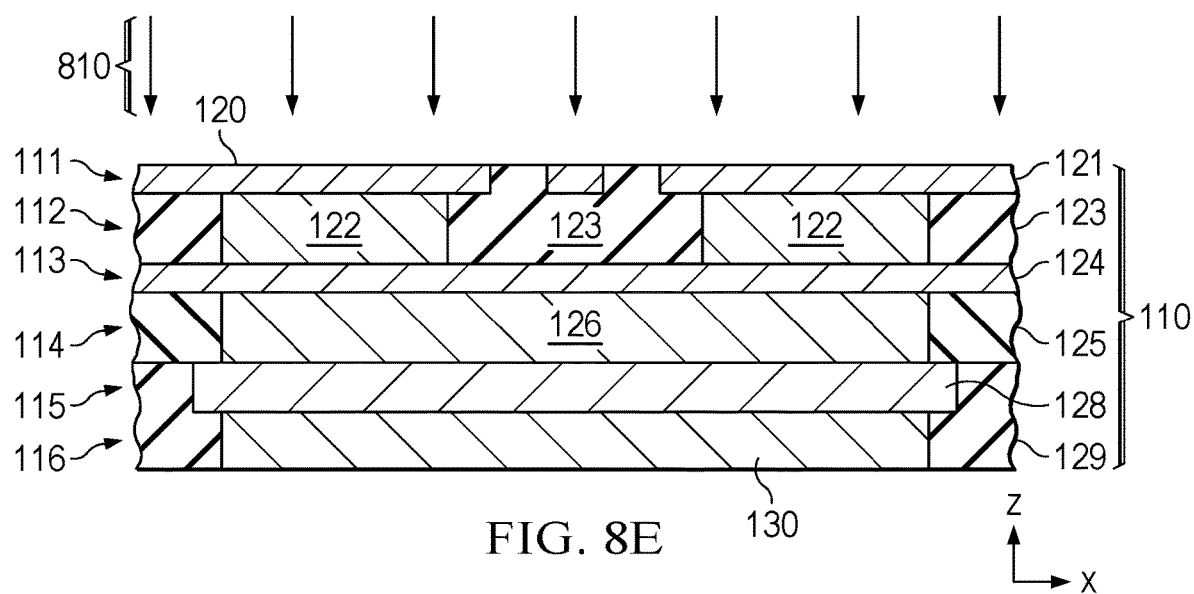

The method 500 in FIG. 5 further includes forming the third level of the multilevel package substrate 110 at 503. FIGS. 8A-8E show formation of the third level on the second level, including forming the third trace layer 115 via another copper electroplating process 800 using a plating mask (not shown). The electroplating process 800 forms the electroplated third trace layer 115 that includes the patterned third conductive trace features 128 on the second conductive via features 126 and on the second dielectric layer 125 of the second level. The third level formation in one example also includes performing another electroplating process 802 in FIG. 8B using a further plating mask 803 to form the third via layer 116 including the patterned third conductive via features 130 on portions of the third conductive trace features 128. As further shown in FIG. 8C, the third level formation also includes performing another dielectric compression molding process 804 that forms the third dielectric layer 129 on and between the third conductive trace features 128 and between the third conductive via features 130. In other implementations, a different dielectric layer formation process can be used, such as a deposition process (not shown). The compression molding process 804 forms the third dielectric layer features 129 to an initial thickness in FIG. 8C that covers the third conductive trace features 128 and the third conductive via features 130. In FIG. 8D a grinding or other planarization process 806 is performed that grinds upper portions of the molded dielectric material 129 and exposes the upper portions of the third conductive via features 130 as shown in FIG. 8D. In another example, a chemical etch is used. In a further example, a chemical mechanical polishing (CMP) process is used. A removal process 810 is performed in FIG. 8E to remove the carrier structure 602 and any remaining portions of the seed layer 604.

Figure 9:
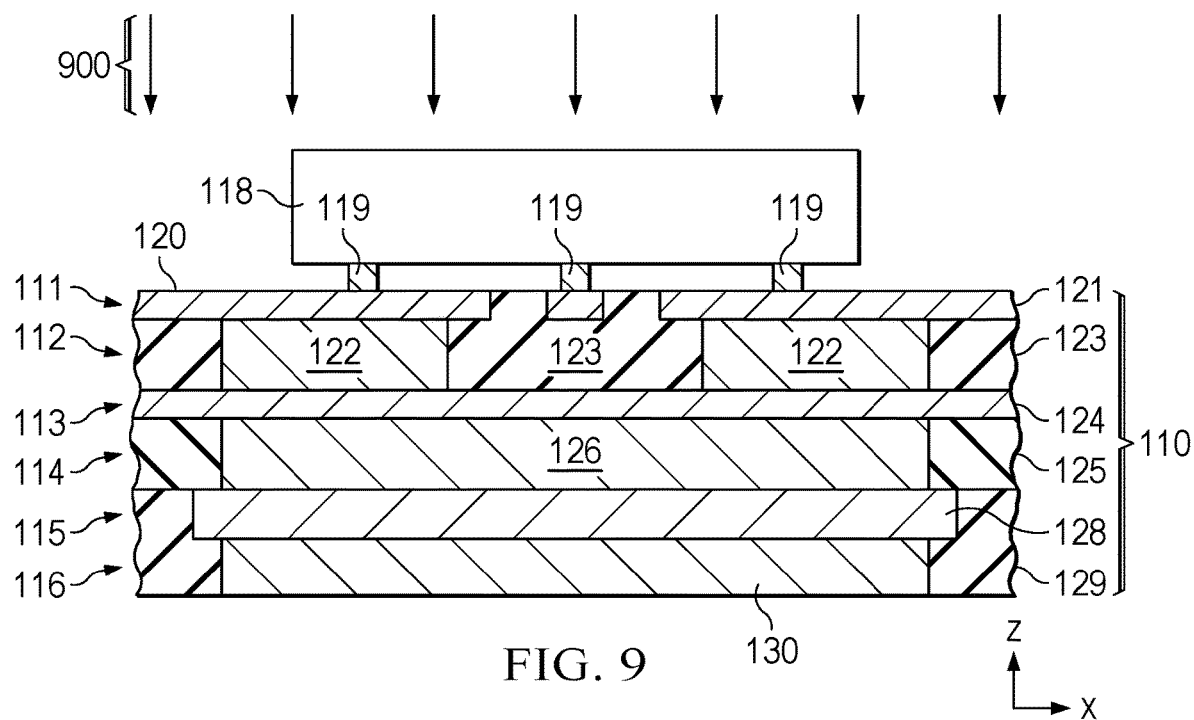
Figure 10:
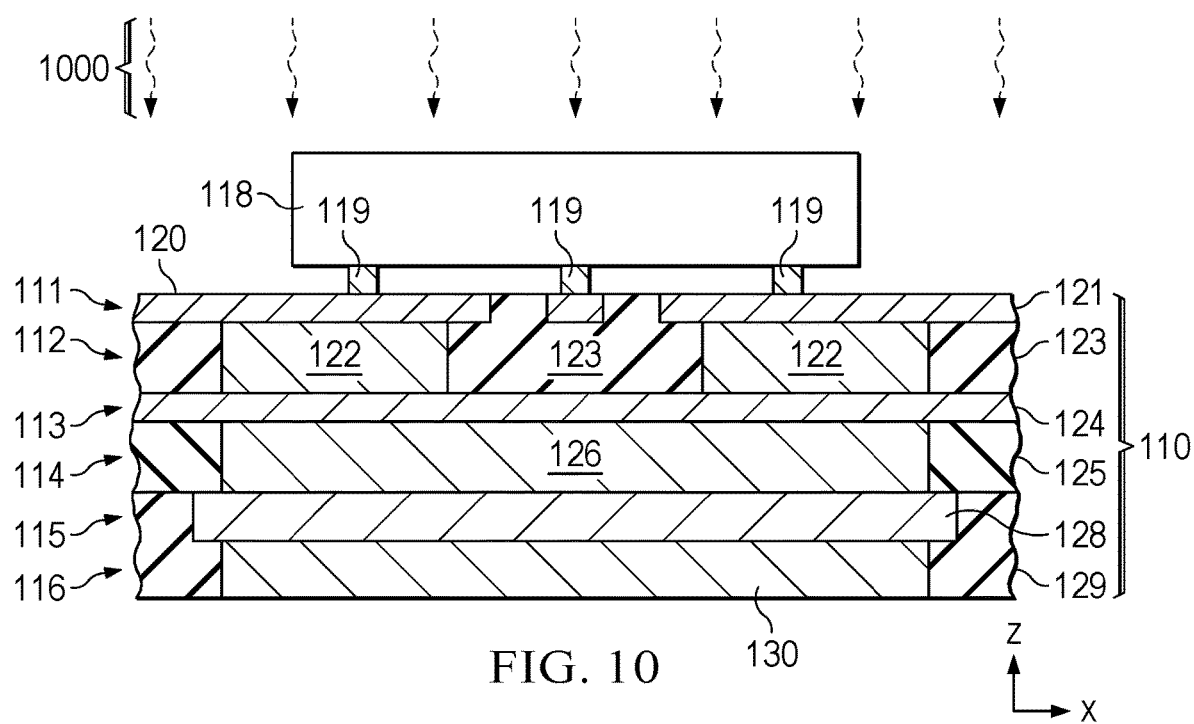

The method continues at 504 in FIG. 5 with die attach processing. FIG. 9 shows a side view of one example that includes performing a flip chip die attach process 900 that attaches the semiconductor die 118 to the top side of the multilevel package substrate 110. The semiconductor die 118 can be attached to the top side of the multilevel package substrate 110 using any suitable techniques and materials. In one example, the semiconductor die 118 is adhered to the top side of the multilevel package substrate 110 using an adhesive (not shown). In the illustrated example, the die attach process 600 includes placement of the semiconductor die 118 using automated pick and place equipment (not shown). In one implementation, bottoms of the conductive features 119 (e.g., copper pillars) of the semiconductor die 118 are dipped in solder, and the semiconductor die 118 is positioned as shown in FIG. 6 with the copper pillars 119 and associated solder placed on respective portions of first conductive trace features 121 of the multilevel package substrate 110.

The method 500 continues at 506 in FIG. 5 with electrical connection of the conductive features 119 of the semiconductor die 118 to the respective first conductive trace features 121 on the top side of the multilevel package substrate 110. In the illustrated example, a thermal reflow process 1000 is performed in FIG. 10 (e.g., at 506 of FIG. 5). The reflow process 1000 is a thermal process that heats and reflows the solder to form solder connections between the conductive copper pillars 119 of the semiconductor die 118 and the respective metal trace features 121 of the first trace layer 111 of the multilevel package substrate 110.

Figure 11:
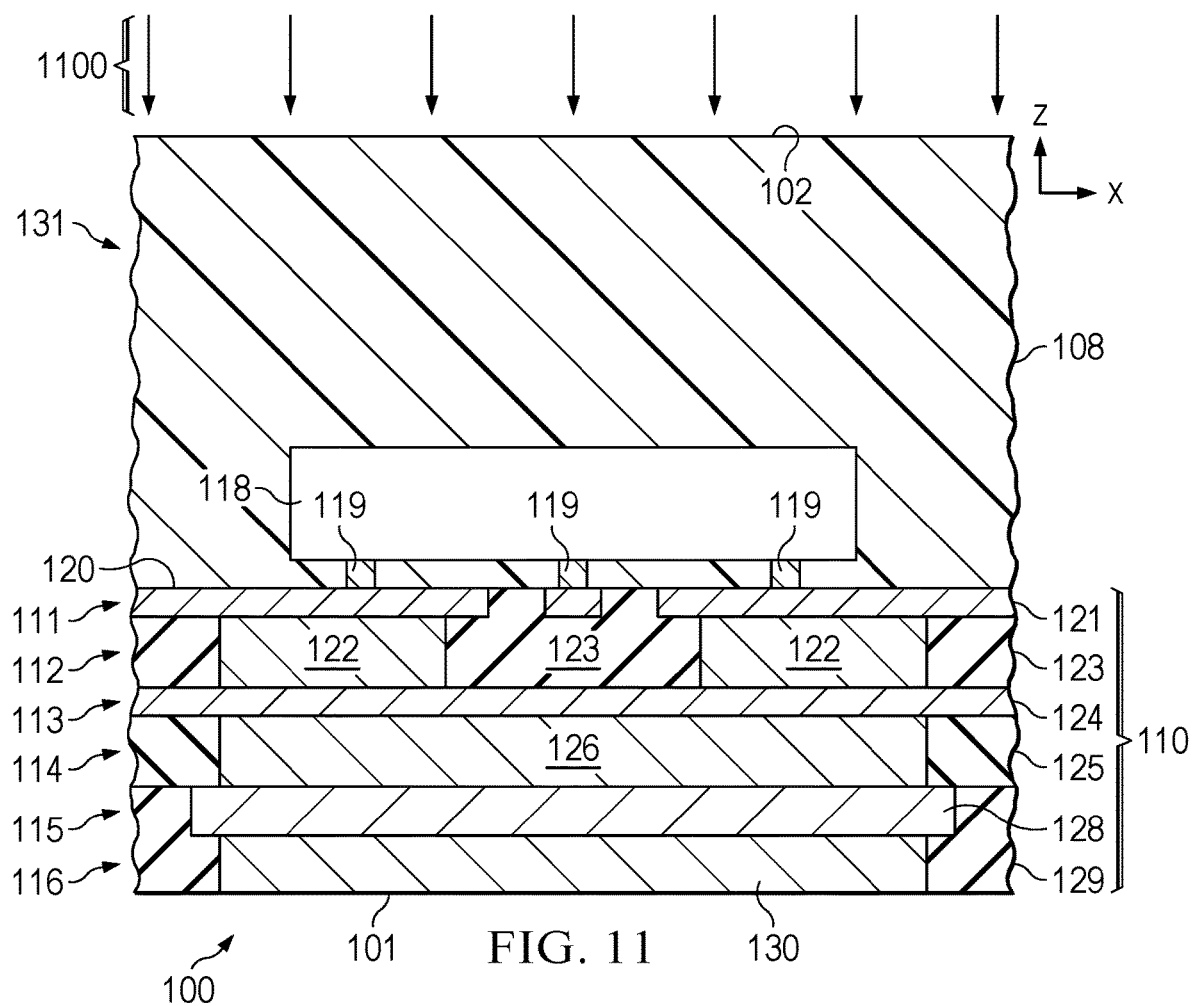
Figure 12:
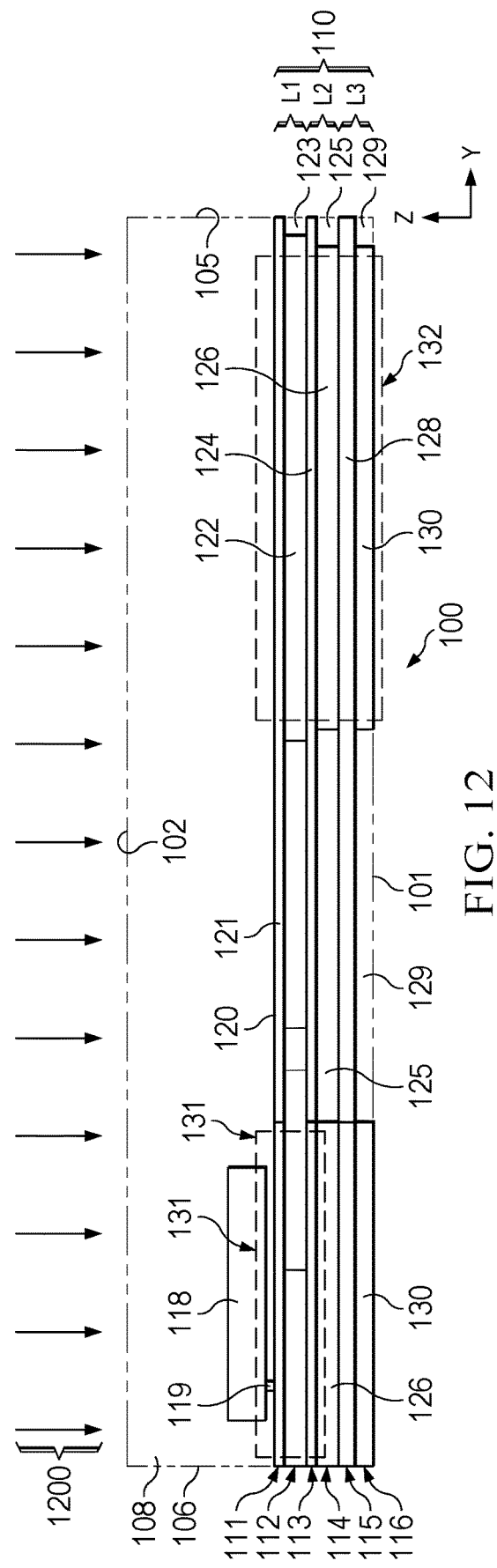

The method 500 continues at 508 in FIG. 5 forming the package structure 108, for example, by molding operations. FIG. 11 shows one example, in which a molding process 1100 is performed that forms the molded plastic package structure 108 that encloses the semiconductor die 118 and the exposed top side of the multilevel package substrate 110. The method 500 in one example also includes package separation at 510 in FIG. 5. FIG. 12 shows one example, in which a package separation process 1200 is performed that separates individual packaged electronic devices 100 from a starting panel array, for example, using saw or laser cutting, chemical etching, etc. As shown in FIG. 12, the separation process 1200 in one example includes cutting along lines (not shown) that are parallel to the second direction Y to form the illustrated device sides 105 and 106, and similar cutting operations are used along cut lines (not shown) parallel to the first direction X to form the front and back sides 103 and 104 (not shown in FIG. 12). The resulting packaged electronic device 100 is shown in FIGS. 1-1H as discussed above.

The described examples can be used in a variety of applications, such as mm wave radar receivers for new and existing industrial and automotive applications such as 60 and 77 GHz devices to help solve vision-sensing challenges in automotive and industrial applications with high-performance sensors that can withstand tough environmental conditions. Integration of the waveguide and transition features in the multilevel package substrate 110 reduces engineering obstacles to facilitate easy design to support a variety of different radar sensors to provide fully integrated products to support sensing applications with long range, high resolution and edge intelligence. The described examples provide multilevel package substrates 110 with three or more levels that include a vertical to horizontal SIW transition 132 and a horizontal SIW to GCPW transition 131 with substrate integrated transitions that can be easily directly soldered to a host PCB without any additional coupling mechanisms to facilitate system level cost reduction. Specific example implementations demonstrate applicability to operation in the WR5 band (e.g., 140-220 GHz) with 33 GHz of −10 dB bandwidth (e.g., 41.25% fractional bandwidth) achieved through a direct vertical to horizontal SIW transition, that advantageously provides low signal attenuation, and optimal isolation using multilevel package substrate technology following high volume production design rules, where specific examples include a transition from a PCB to a receiver die with 50 Ohm as output impedance which can be used as a stand-alone RF system. The illustrated examples, moreover, provide a solution with a waveguide-based patch coupled transition inside the multilevel package substrate 110 that can achieve 23 GHz of −10 dB bandwidth with a thin substrate (e.g., approximately 200 μm) to facilitate space savings in system designs. The illustrated example provides a three level substrate structure 110 with the PCB-to-die transition implemented using the first and second transitions 131 and 132. The example electronic device 100, moreover, can be flip chip soldered to a host PCB (e.g., as shown in FIG. 1 above) and mounted with a solder interconnect to provide a stand-alone RF system with a direct signal transition through PCB based plated via and solder acting as a waveguide extension to the vertical SIW of the multilevel package substrate 110. Different implementations are possible using multilevel package substrate manufacturing design rules and standard materials, and a specific transition design can be scaled depending on the dielectric properties of the materials used with little or no manufacturing reliability risk. Described examples can be used in applications that benefit from low loss and minimal lateral radiation leakage from the transition, for example, is a feed structure for slotted waveguide antennas (e.g., leaky wave antennas).

Modifications are possible in the described examples, and other implementations are possible, within the scope of the claims.

The invention claimed is:

1. An electronic device, comprising:
a multilevel package substrate having a first side, a second side, a first level, a second level, a third level, a horizontal substrate integrated waveguide (SIW), a vertical SIW, a grounded coplanar waveguide (GCPW), a first transition, and a second transition, the first side extending in a first plane of orthogonal first and second directions, the second side extending in a second plane of the first and second directions, the first and second planes spaced apart from one another along a third direction that is orthogonal to the first and second directions, the horizontal SIW including a first set of conductive features of the first and second levels that surround a channel that extends along the second direction, the first transition including a signal trace and a ground trace in the first level that connect the horizontal SIW to the GCPW along the second side, the vertical SIW including a second set of conductive features of the first, second and third levels that surround an opening that extends along the third direction to the first side, the second transition including a conductive cover feature of the first level that extends over the opening of the vertical SIW;

a semiconductor die attached to the second side of the multilevel package substrate and having a first conductive structure coupled to the signal trace and a second conductive structure coupled to the ground trace; and a package structure that encloses the semiconductor die and a portion of the multilevel package substrate.

2. The electronic device of claim 1, wherein:

the ground trace is a first ground trace that extends along the second direction and is spaced apart from a first side of the signal trace along the first direction;

the first transition includes a second ground trace in the first level that extends along the second direction and is spaced apart from an opposite second side of the signal trace along the first direction; and the semiconductor die has a third conductive structure coupled to the second ground trace.

3. The electronic device of claim 2, wherein:

the electronic device has opposite third and fourth sides spaced apart from one another along the first direction, and opposite fifth and sixth sides spaced apart from one another along the second direction;

the first level includes a first trace layer with a patterned first conductive trace feature that forms the signal trace, the first and second ground traces and the conductive cover feature;

the signal trace has a first portion and a tapered second portion, the first portion of the signal trace has a first width along the first direction and extends toward the fifth side along the second direction from a connection of the first conductive structure of the semiconductor die to the tapered second portion of the signal trace, the second portion of the signal trace tapers outward toward the fourth and fifth sides to a larger second width along the first direction and extends toward the fifth side along the second direction from the first portion to join the conductive cover feature;

the first and second ground traces extend toward the fifth side along the second direction from a respective connection of the second and third conductive structures of the semiconductor die to the conductive cover feature; and the conductive cover feature extends from the second portion of the signal trace and from the first and second ground traces to the fifth side of the electronic device and covers the opening of the vertical SIW.

4. The electronic device of claim 3, wherein:

the first level includes a first via layer with a patterned first conductive via feature on the first conductive trace feature, the first conductive via feature forming sidewalls of the channel of the horizontal SIW; and the second level includes a second trace layer with a patterned second conductive trace feature on the first conductive via feature, a first portion of the second conductive trace feature forming a bottom of the channel of the horizontal SIW, and the opening of the vertical SIW extends through a second portion of the second conductive trace feature.

5. The electronic device of claim 4, wherein:

the second level includes a second via layer with a patterned second conductive via feature on the second trace feature;

the third level includes a third trace layer with a patterned third conductive trace feature on the second conductive via feature;

the third level includes a third via layer with a patterned third conductive via feature on the third conductive trace feature; and the opening of the vertical SIW extends through the second conductive via feature, the third conductive trace feature, and the patterned third conductive via feature.

6. The electronic device of claim 1, wherein:

the first level includes a first via layer with a patterned first conductive via feature that forms sidewalls of the channel of the horizontal SIW; and the second level includes a second trace layer with a patterned second conductive trace feature on the first conductive via feature, a first portion of the second conductive trace feature forming a bottom of the channel of the horizontal SIW, and the opening of the vertical SIW extends through a second portion of the second conductive trace feature.

7. The electronic device of claim 6, wherein:

the second level includes a second via layer with a patterned second conductive via feature on the second trace feature;

the third level includes a third trace layer with a patterned third conductive trace feature on the second conductive via feature;

the third level includes a third via layer with a patterned third conductive via feature on the third conductive trace feature; and the opening of the vertical SIW extends through the second conductive via feature, the third conductive trace feature, and the patterned third conductive via feature.

8. A multilevel package substrate, comprising:

opposite first and second sides extending in respective first and second planes of orthogonal first and second directions, the first and second planes spaced apart from one another along a third direction that is orthogonal to the first and second directions;

first, second, and third levels;

a horizontal substrate integrated waveguide (SIW) that includes a first set of conductive features of the first and second levels that surround a channel that extends along the second direction, a vertical SIW including a second set of conductive features of the first, second and third levels that surround an opening that extends along the third direction to the first side;

a grounded coplanar waveguide (GCPW);

a first transition including a signal trace and a ground trace in the first level that connect the horizontal SIW to the GCPW along the second side; and a second transition including a conductive cover feature of the first level that extends over the opening of the vertical SIW.

9. The multilevel package substrate of claim 8, wherein:

the ground trace is a first ground trace that extends along the second direction and is spaced apart from a first side of the signal trace along the first direction;

the first transition includes a second ground trace in the first level that extends along the second direction and is spaced apart from an opposite second side of the signal trace along the first direction; and the semiconductor die has a third conductive structure coupled to the second ground trace.

10. The multilevel package substrate of claim 9, wherein:

the multilevel package substrate has opposite third and fourth sides spaced apart from one another along the first direction, and opposite fifth and sixth sides spaced apart from one another along the second direction;

the first level includes a first trace layer with a patterned first conductive trace feature that forms the signal trace, the first and second ground traces and the conductive cover feature;

the signal trace has a first portion and a tapered second portion, the first portion of the signal trace has a first width along the first direction and extends toward the fifth side along the second direction from a connection of the first conductive structure of the semiconductor die to the tapered second portion of the signal trace, the second portion of the signal trace tapers outward toward the fourth and fifth sides to a larger second width along the first direction and extends toward the fifth side along the second direction from the first portion to join the conductive cover feature;

the first and second ground traces extend toward the fifth side along the second direction from a respective connection of the second and third conductive structures of the semiconductor die to the conductive cover feature; and the conductive cover feature extends from the second portion of the signal trace and from the first and second ground traces to the fifth side of the electronic device and covers the opening of the vertical SIW.

11. The multilevel package substrate of claim 8, wherein:
the first level includes a first via layer with a patterned first conductive via feature that forms sidewalls of the channel of the horizontal SIW; and
the second level includes a second trace layer with a patterned second conductive trace feature on the first conductive via feature, a first portion of the second conductive trace feature forming a bottom of the channel of the horizontal SIW, and the opening of the vertical SIW extends through a second portion of the second conductive trace feature.

12. The multilevel package substrate of claim 11, wherein:
the second level includes a second via layer with a patterned second conductive via feature on the second trace feature;
the third level includes a third trace layer with a patterned third conductive trace feature on the second conductive via feature;
the third level includes a third via layer with a patterned third conductive via feature on the third conductive trace feature; and
the opening of the vertical SIW extends through the second conductive via feature, the third conductive trace feature, and the patterned third conductive via feature.

13. A system, comprising:
a printed circuit board (PCB) having a conductive structure to connect to a vertical substrate integrated waveguide (SIW); and
an electronic device attached to the PCB and comprising a multilevel package substrate, a semiconductor die, and a package structure that encloses the semiconductor die and a portion of the multilevel package substrate;
the multilevel package substrate having a first side, a second side, a first level, a second level, a third level, a horizontal substrate integrated waveguide (SIW), a vertical SIW, a grounded coplanar waveguide (GCPW), a first transition, and a second transition, the first side extending in a first plane of orthogonal first and second directions, the second side extending in a second plane of the first and second directions, the first and second planes spaced apart from one another along a third direction that is orthogonal to the first and second directions, the horizontal SIW including a first set of conductive features of the first and second levels that surround a channel that extends along the second direction, the first transition including a signal trace and a ground trace in the first level that connect the horizontal SIW to the GCPW along the second side, the vertical SIW including a second set of conductive features of the first, second and third levels that surround an opening that extends along the third direction to the first side, the second transition including a conductive cover feature of the first level that extends over the opening of the vertical SIW; and the semiconductor die attached to the second side of the multilevel package substrate and having a first conductive structure coupled to the signal trace and a second conductive structure coupled to the ground trace.

14. The system of claim 13, wherein the electronic device is a mm-wave radar receiver.

15. The system of claim 13, wherein:
the ground trace is a first ground trace that extends along the second direction and is spaced apart from a first side of the signal trace along the first direction;
the first transition includes a second ground trace in the first level that extends along the second direction and is spaced apart from an opposite second side of the signal trace along the first direction; and
the semiconductor die has a third conductive structure coupled to the second ground trace.

16. The system of claim 13, wherein:
the first level includes a first via layer with a patterned first conductive via feature that forms sidewalls of the channel of the horizontal SIW; and
the second level includes a second trace layer with a patterned second conductive trace feature on the first conductive via feature, a first portion of the second conductive trace feature forming a bottom of the channel of the horizontal SIW, and the opening of the vertical SIW extends through a second portion of the second conductive trace feature.

17. The system of claim 16, wherein:
the second level includes a second via layer with a patterned second conductive via feature on the second trace feature;
the third level includes a third trace layer with a patterned third conductive trace feature on the second conductive via feature;
the third level includes a third via layer with a patterned third conductive via feature on the third conductive trace feature; and
the opening of the vertical SIW extends through the second conductive via feature, the third conductive trace feature, and the patterned third conductive via feature.

18. A method of fabricating an electronic device, the method comprising:
fabricating a multilevel package substrate having: opposite first and second sides extending in respective first and second planes of orthogonal first and second directions, the first and second planes spaced apart from one another along a third direction that is orthogonal to the first and second directions; a first level; a second level; a third level; a horizontal substrate integrated waveguide (SIW); a vertical SIW; a grounded coplanar waveguide (GCPW); a first transition; and a second transition, the horizontal SIW including a first set of conductive features of the first and second levels that surround a channel that extends along the second direction, the first transition including a signal trace and a ground trace in the first level that connect the horizontal SIW to the GCPW along the second side, the vertical SIW including a second set of conductive features of the first, second and third levels that surround an opening that extends along the third direction to the first side, the second transition including a conductive cover feature of the first level that extends over the opening of the vertical SIW;

attaching a semiconductor die to the second side of the multilevel package substrate;

coupling a first conductive structure of the semiconductor die to the signal trace, coupling a second conductive structure of the semiconductor die to the ground trace; and forming a package structure that encloses the semiconductor die and a portion of the multilevel package substrate.

19. The method of claim 18, wherein:

the ground trace is a first ground trace that extends along the second direction and is spaced apart from a first side of the signal trace along the first direction;

the first transition includes a second ground trace in the first level that extends along the second direction and is spaced apart from an opposite second side of the signal trace along the first direction; and the semiconductor die has a third conductive structure coupled to the second ground trace.

20. The method of claim 18, wherein:

the first level includes a first via layer with a patterned first conductive via feature that forms sidewalls of the channel of the horizontal SIW; and the second level includes a second trace layer with a patterned second conductive trace feature on the first conductive via feature, a first portion of the second conductive trace feature forming a bottom of the channel of the horizontal SIW, and the opening of the vertical SIW extends through a second portion of the second conductive trace feature.

* * * * *